(12) United States Patent
Arita et al.

(10) Patent No.: US 12,424,418 B2
(45) Date of Patent: Sep. 23, 2025

(54) ACTIVE GAS GENERATION APPARATUS

(71) Applicant: Toshiba Mitsubishi-Electric Industrial Systems Corporation, Tokyo (JP)

(72) Inventors: Ren Arita, Tokyo (JP); Kensuke Watanabe, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 0 days.

(21) Appl. No.: 18/570,654

(22) PCT Filed: May 18, 2022

(86) PCT No.: PCT/JP2022/020652
§ 371 (c)(1),
(2) Date: Dec. 15, 2023

(87) PCT Pub. No.: WO2023/223454
PCT Pub. Date: Nov. 23, 2023

(65) Prior Publication Data
US 2024/0297024 A1 Sep. 5, 2024

(51) Int. Cl.
*H01J 37/32* (2006.01)
(52) U.S. Cl.
CPC .. *H01J 37/32568* (2013.01); *H01J 37/32348* (2013.01); *H01J 37/3244* (2013.01);
(Continued)
(58) Field of Classification Search
CPC ........... H01J 37/32568; H01J 37/32348; H01J 37/3244; H01J 37/32541; H01J 37/32559;
(Continued)

(56) References Cited

U.S. PATENT DOCUMENTS 5,605,637 A * 2/1997 Shan ................. H01J 37/32477
156/345.47
5,982,100 A * 11/1999 Ghanbari ............. H01J 37/321
315/111.21
(Continued)

FOREIGN PATENT DOCUMENTS

CN 104812154 A * 7/2015
JP 6873588 B1 5/2021
(Continued)

OTHER PUBLICATIONS

International Search Report and Written Opinion mailed on Jul. 19, 2022, received for PCT Application PCT/JP2022/020652, filed on May 18, 2022, 09 pages including English Translation.

*Primary Examiner* — Adam D Houston
(74) *Attorney, Agent, or Firm* — XSENSUS LLP

(57) ABSTRACT

An object of the present disclosure is to obtain an active gas generation apparatus capable of supplying a highly concentrated active gas from a gas ejection port to a processing space at a subsequent stage. Then, in the active gas generation apparatus (51) of the present disclosure, in a main dielectric space being a space in which an electrode dielectric film (30) and an electrode dielectric film (40) face each other, a region where electrode conductive films (31) and (41) overlap each other in a plan view is defined as a main discharge space (50). In an auxiliary dielectric space being a space where the electrode dielectric film 30 and a shield dielectric film 8 face each other, a region including a dielectric through hole (14) and a cover through hole (15) is defined as an auxiliary discharge space (58). The auxiliary discharge space (58) includes a part of a buffer space (9) above the shield dielectric film (8), and a path leading from the auxiliary discharge space (58) to the gas ejection port (61.62) is defined as an active gas flow path.

6 Claims, 15 Drawing Sheets

(52) U.S. Cl.
CPC .. *H01J 37/32541* (2013.01); *H01J 37/32559* (2013.01); *H01J 2237/032* (2013.01); *H01J 2237/036* (2013.01); *H01J 2237/038* (2013.01)

(58) Field of Classification Search
CPC ........... H01J 2237/032; H01J 2237/036; H01J 2237/038
See application file for complete search history.

(56) References Cited

U.S. PATENT DOCUMENTS

| | | | |
|---|---|---|---|
| 9,490,106 B2 * | 11/2016 | Drewery | H01J 37/32651 |
| 10,504,754 B2 * | 12/2019 | Tan | H01L 21/6719 |
| 10,522,371 B2 * | 12/2019 | Tan | H01L 21/6719 |
| 10,573,496 B2 * | 2/2020 | Lubomirsky | H01J 37/32357 |
| 10,593,560 B2 * | 3/2020 | Cho | H01J 37/321 |
| 10,854,426 B2 * | 12/2020 | Cui | H10D 89/00 |
| 10,892,198 B2 * | 1/2021 | Rodrigo | H01J 37/32972 |
| 11,532,458 B2 * | 12/2022 | Arita | H01J 37/3255 |
| 11,594,428 B2 * | 2/2023 | Tran | H01L 21/67248 |
| 11,839,014 B2 * | 12/2023 | Watanabe | H01J 37/32348 |
| 12,219,688 B2 * | 2/2025 | Hiraoka | H05H 1/245 |
| 2019/0287770 A1 * | 9/2019 | Iwase | H01J 37/32834 |
| 2021/0057192 A1 * | 2/2021 | Arita | H01J 37/32357 |
| 2021/0233748 A1 * | 7/2021 | Watanabe | C23C 16/452 |
| 2022/0028663 A1 * | 1/2022 | Nagorny | H01J 37/32541 |
| 2022/0059322 A1 * | 2/2022 | Arita | H01J 37/32541 |
| 2022/0087001 A1 * | 3/2022 | Sato | H05H 1/2439 |
| 2022/0174807 A1 * | 6/2022 | Arita | H05H 1/2425 |
| 2023/0162947 A1 * | 5/2023 | Ye | H01J 37/32541 427/579 |
| 2024/0297024 A1 * | 9/2024 | Arita | H01J 37/32568 |
| 2025/0016904 A1 * | 1/2025 | Arita | H01J 37/32348 |

FOREIGN PATENT DOCUMENTS

| | | | | |
|---|---|---|---|---|
| JP | 7297399 B1 * | 6/2023 | ........ | H01J 37/32348 |
| WO | WO-2021106100 A1 * | 6/2021 | ............. | B01J 19/08 |
| WO | WO-2023080324 A1 * | 5/2023 | ............. | H01J 37/32 |

* cited by examiner

ACTIVE GAS GENERATION APPARATUS

CROSS-REFERENCE TO RELATED APPLICATION

The present application is based on PCT filing PCT/JP2022/020652, filed May 18, 2022, the entire contents of which are incorporated herein by reference.

TECHNICAL FIELD

The present disclosure relates to an active gas generation apparatus that has a parallel plate system electrode structure and generates an active gas using dielectric barrier discharge.

BACKGROUND ART

In a conventional active gas generation apparatus having a parallel plate system electrode structure and adopting dielectric barrier discharge, a gap between a metal electrode (electrode conductive film) and a dielectric film (electrode dielectric film) facing each other or a gap between dielectric films facing each other serves as a discharge space.

A conventional active gas generation apparatus adopts a parallel plate system dielectric barrier discharge in which a dielectric barrier discharge is generated in a discharge space, and a source gas put into the discharge space is activated to generate an active gas.

The active gas generated in the discharge space of the conventional active gas generation apparatus passes through a non-discharge space and then is supplied to a processing space at the subsequent stage where the active gas is used. Various processing apparatuses are disposed in the processing space.

Regarding the active gas generation apparatus, the following two operating characteristics are important.

First operating characteristic . . . supplying an active gas with a high concentration to a processing space at a subsequent stage Second operating characteristic . . . the active gas does not contain impurities With respect to the first operating characteristic, the active gas is generally in an unstable chemical state, and the active gas is changed into an inert gas by disappearance (gas collisional deactivation) of the active gas due to a reaction (for example, "three-body collision") between the source gas and the active gas, or disappearance (surface deactivation) due to collision between a member constituting the apparatus and the active gas.

Therefore, in order to keep the first operating characteristic, it is necessary to take countermeasures against the above-described gas collisional deactivation and surface deactivation. On the other hand, with respect to the second operating characteristic, it is necessary to take measures to cause the active gas at the time of generation not to contain impurities.

Conventional active gas generation apparatuses generate active gas by dielectric barrier discharge in a discharge space. Therefore, in a discharge space and a region near the discharge space, when disposed in an environment in contact with the discharge space and the region near the discharge space, a metal material is more easily ionized than a dielectric being an insulator. When the metal material is ionized, impurities of metal ions are mixed into the active gas. For this reason, in order to maintain the second operating characteristic, it is necessary to take metal material measures in which the metal material is disposed so as not to be in contact with the discharge space and a region in the vicinity thereof.

As an active gas generation apparatus in consideration of the first and second operating characteristics, for example, there is an active gas generation apparatus disclosed in Patent Document 1.

In this active gas generation apparatus, in order to prevent the disappearance of the active gas, a part of the active gas flow path being a space through which the active gas passes is filled with an active gas auxiliary member, and the volume of the active gas flow path is intentionally reduced to suppress gas collisional deactivation, thereby improving the first operating characteristic.

In addition, in consideration of the second operating characteristic, a high-voltage conductive film for applying a voltage and an auxiliary conductive film for applying a ground potential are provided independently of each other on the dielectric film on the high-voltage electrode component side, and ionization of the active gas auxiliary member is suppressed even when the active gas auxiliary member is a metal material.

PRIOR ART DOCUMENT

Patent Document

Patent Document 1: Japanese Patent No. 6873588

SUMMARY

Problem to be Solved by the Invention

However, the conventional active gas generation apparatus disclosed in Patent Document 1 has the following disadvantages.

First disadvantage . . . Since the active gas flow path is intentionally narrowed, the degree of collision between the parts in contact with the active gas flow path and the active gas is increased, which causes an increase in surface deactivation.

Second disadvantage . . . In order to prevent a short circuit between the high-voltage conductive film and the auxiliary conductive film, when the distance between the high-voltage conductive film and the auxiliary conductive film increases, the distance between the discharge space and the processing space at the subsequent stage becomes longer by the amount of the increased distance, and therefore the deactivation amount of the active gas increases.

Hereinafter, the distance between the high-voltage conductive film and the auxiliary conductive film is referred to as a "distance between conductive films". The high-voltage conductive film and the auxiliary conductive film are both provided on the high-voltage dielectric film. Thus, by providing an uneven structure such as an insulator in the high-voltage dielectric film, the distance between conductive films can be shortened to some extent. However, even if the high-voltage dielectric film is provided with an insulator, there is a limit to shortening the distance between conductive films, and there causes another problem that extra processing of providing the high-voltage dielectric film with the insulator having the uneven structure is required.

As described above, the conventional active gas generation apparatus has a problem that surface deactivation cannot be suppressed and is insufficient for ejecting a high concentration active gas from the gas ejection port.

An object of the present disclosure is to solve the above problems and to obtain an active gas generation apparatus capable of supplying a highly concentrated active gas from a gas ejection port to a processing space at a subsequent stage. More desirably, an object of the present disclosure is to obtain an active gas generation apparatus that does not require processing of an electrode dielectric film.

Means to Solve the Problem

An active gas generation apparatus of the present disclosure is an active gas generation apparatus configured to generate an active gas by activating a source gas supplied to a discharge space, the active gas generation apparatus including: a housing configured to house an electrode structure (body) in an in-housing space, the housing having conductivity; and the electrode structure disposed on a bottom surface of the housing. The housing has a bottom surface structure including a flat surface and a buffer space recessed in a depth direction from the flat surface, and the electrode structure is disposed to close the buffer space. The electrode structure includes: a first electrode component, and a second electrode component provided below the first electrode component. The first electrode component includes a first electrode dielectric film and a first electrode conductive film formed on an upper surface of the first electrode dielectric film. The second electrode component includes a second electrode dielectric film and a second electrode conductive film formed on a lower surface of the second electrode dielectric film, and the second electrode conductive film and the flat surface of the housing are in contact with each other. The second electrode dielectric film has a dielectric through hole penetrating the second electrode dielectric film in a region overlapping the buffer space in a plan view, the second electrode conductive film has a conductive film opening in a region overlapping the buffer space in a plan view, the conductive film opening overlaps the dielectric through hole in a plan view, and an outer circumferential line of the conductive film opening is defined as an electrode boundary line. The second electrode component further includes a cover dielectric film covering the electrode boundary line of the second electrode conductive film in the buffer space, and the cover dielectric film has a cover through hole penetrating the cover dielectric film in a region overlapping the dielectric through hole in a plan view. The active gas generation apparatus further includes: a shield dielectric film provided in a region overlapping the dielectric through-hole and the cover through hole in a plan view on a bottom surface of the buffer space, and a gas ejection port provided to penetrate a bottom surface of the buffer space in a peripheral region of the shield dielectric film. The gas ejection port overlaps the cover dielectric film in a plan view, and does not overlap the dielectric through hole nor the cover through hole in a plan view. An AC voltage is applied to the first electrode conductive film, and the second electrode conductive film is set to a reference potential through the housing. A space in which the first electrode dielectric film and the second electrode dielectric film face each other is defined as a main dielectric space, and a space in which the first electrode dielectric film and the shield dielectric film face each other is defined as an auxiliary dielectric space. A region where the first and second electrode conductive films overlap in a plan view in the main dielectric space is defined as a main discharge space, a region including the dielectric through hole and the cover through hole in the auxiliary dielectric space is defined as an auxiliary discharge space, and the auxiliary discharge space includes a part of the buffer space above the shield dielectric film. The discharge space includes the main discharge space and the auxiliary discharge space. A path leading from the auxiliary discharge space to the gas ejection port is defined as an active gas flow path.

Effects of the Invention

In the active gas generation apparatus of the present disclosure, since the auxiliary discharge space being a part of the discharge space includes the dielectric through hole, the cover through hole, and a part of the buffer space, it is possible to suppress the deactivation amount of the active gas by suppressing the active gas flow path leading from the auxiliary discharge space to the gas ejection port to a necessary minimum volume.

Furthermore, since the cover dielectric film in the second electrode component of the active gas generation apparatus of the present disclosure covers the electrode boundary line of the second electrode conductive film in the buffer space and overlaps the gas ejection port in a plan view, it is possible to suppress a surface deactivation phenomenon in which the active gas disappears accompanying the active gas colliding with the second electrode conductive film.

As a result, the active gas generation apparatus of the present disclosure can supply the highly concentrated active gas from the gas ejection port to the processing space at the subsequent stage.

Furthermore, since the electrode structure in the active gas generation apparatus of the present disclosure does not have a conductive film other than the first and second electrode conductive films, it is not necessary to process the first and second electrode dielectric films, so that active gas generation apparatus can be implemented relatively inexpensively.

The objects, features, aspects, and advantages of the present disclosure will become more apparent from the following detailed description and the accompanying drawings.

DESCRIPTION OF EMBODIMENTS

First Embodiment

Figure 1:
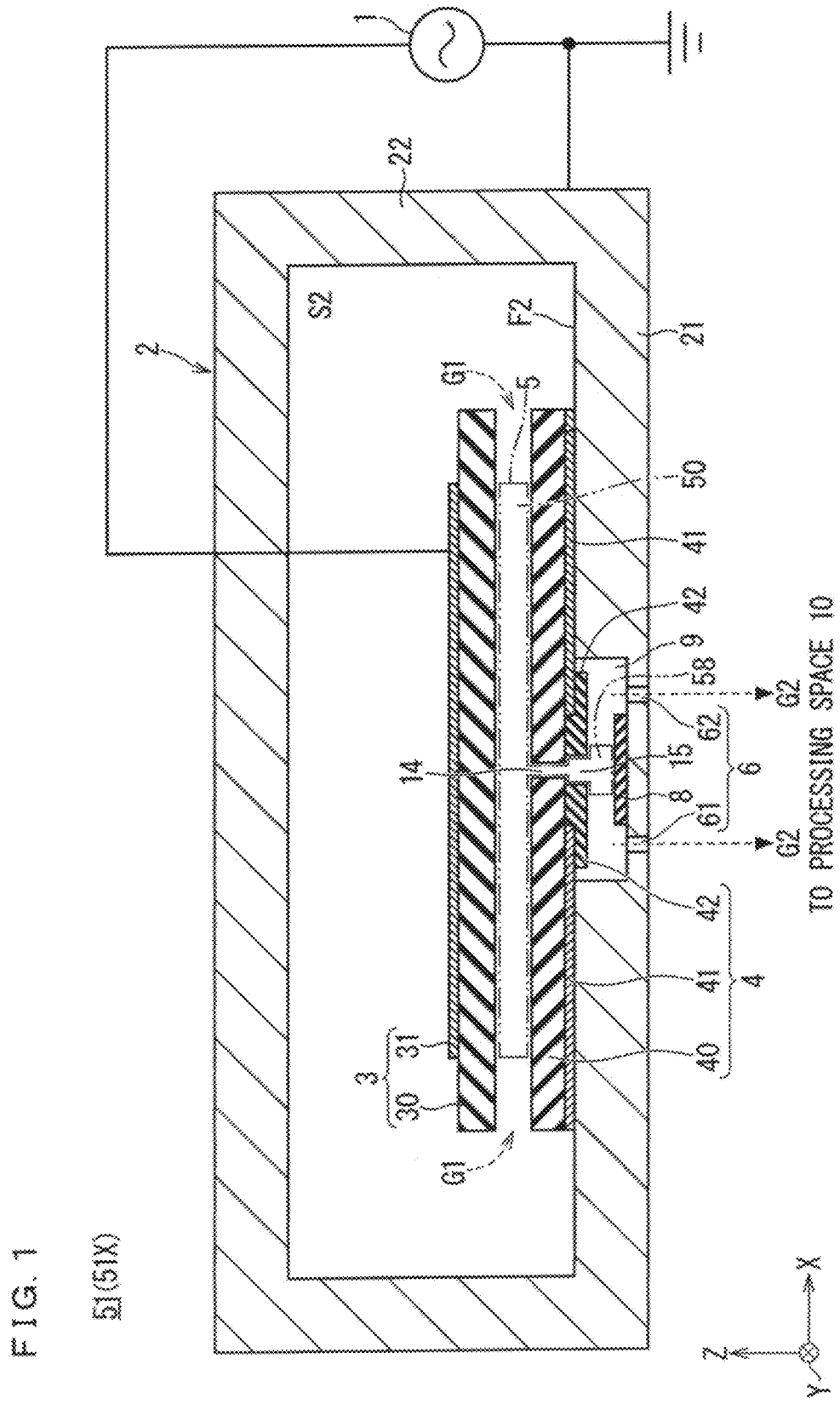
FIG. 1 is an explanatory diagram showing a cross-sectional structure of an active gas generation apparatus of a first embodiment.

FIG. 1 is an explanatory diagram schematically showing a cross-sectional structure of an active gas generation apparatus 51 of a first embodiment in the present disclosure. An XYZ orthogonal coordinate system is shown in FIG. 1.

The active gas generation apparatus 51 of the first embodiment activates the source gas G1 supplied to the discharge space 5 in the dielectric barrier discharge state to generate the active gas G2.

The active gas generation apparatus 51 includes a metal housing 2, an electrode structure (body), an AC power supply 1, and a shield dielectric film 8 as main components.

The metal housing 2 having conductivity has an in-housing space S2, and houses an electrode structure in the in-housing space S2.

The metal housing 2 is a housing made of metal surrounding the in-housing space S2, and includes a housing bottom surface 21 and a housing side surface 22. The housing bottom surface 21 has a bottom surface structure including a flat surface F2 and a buffer space 9 recessed in a depth direction (−Z direction) from the flat surface F2.

On the other hand, the electrode structure includes a high-voltage application electrode unit 3 and a ground potential electrode unit 4 as main components, and is disposed on the housing bottom surface 21 of the metal housing 2 so as to close the buffer space 9.

Hereinafter, the electrode structure of the first embodiment will be described in detail. The electrode structure includes a high-voltage application electrode unit 3 being a first electrode component, and a ground potential electrode unit 4 being a second electrode component provided below the high-voltage application electrode unit 3.

The high-voltage application electrode unit 3 being a first electrode component includes an electrode dielectric film 30 being a first electrode dielectric film, and an electrode conductive film 31 being a first electrode conductive film formed on the upper surface of the electrode dielectric film 30. The electrode dielectric film 30 has a dielectric as a constituent material, and the electrode conductive film 31 has a conductor such as metal as a constituent material.

The ground potential electrode unit 4 being the second electrode component includes an electrode dielectric film 40 being a second electrode dielectric film, an electrode conductive film 41 being a second electrode conductive film formed on the lower surface of the electrode dielectric film 40, and a cover dielectric film 42. The cover dielectric film 42 is provided on the lower surfaces of the electrode dielectric film 40 and the electrode conductive film 41 in the buffer space 9. The electrode dielectric film 40 and the cover dielectric film 42 have dielectrics as constituent materials, and the electrode conductive film 41 has a conductor such as metal as a constituent material.

The electrode structure is disposed on the housing bottom surface 21 of the metal housing 2 in a mode that the electrode conductive film 41 and the flat surface F2 on the housing bottom surface 21 of the metal housing 2 are in contact with each other.

The electrode dielectric film 40 being the second electrode dielectric film has a through hole 14 being a dielectric through hole penetrating the electrode dielectric film 40 in a region overlapping the buffer space 9 in a plan view.

The cover dielectric film 42 has a through hole 15 being a cover through hole penetrating the cover dielectric film 42 in a region overlapping the buffer space 9 in a plan view and overlapping the through hole 14 in a plan view.

On the bottom surface of the buffer space 9, the shield dielectric film 8 includes a region overlapping the through hole 14 and the through hole 15 in a plan view, and has a shape wider than each of the through hole 14 and the through hole 15.

The housing bottom surface 21 of the metal housing 2 has two gas ejection ports 61 and 62 provided to penetrate the bottom surface of the buffer space 9 in the peripheral region of the shield dielectric film 8. Each of the gas ejection ports 61 and 62 exhibits a vertical structure directed downward and extending vertically along the Z direction without being inclined toward the horizontal direction. Both the gas ejection ports 61 and 62 overlap the cover dielectric film 42 in a plan view, and neither of them overlaps the through hole 14 and the through hole 15 in a plan view. Hereinafter, the combination of the gas ejection ports 61 and 62 may be referred to as a "gas ejection port group 6".

An AC voltage is applied as an applied voltage from the AC power supply 1 to the electrode conductive film 31 being the first electrode conductive film, and a setting potential being a reference potential is assigned to the electrode conductive film 41 being the second electrode conductive film through the housing bottom surface 21 of the metal housing 2.

In the active gas generation apparatus 51 of the first embodiment having this configuration, a space in which the electrode dielectric film 30 being the first electrode dielectric film and the electrode dielectric film 40 being the second electrode dielectric film face each other is defined as a main dielectric space. In addition, a space where the electrode dielectric film 30 and the shield dielectric film 8 face each other is defined as an auxiliary dielectric space. A region where the electrode conductive films 31 and 41 overlap in a plan view in the main dielectric space is defined as the main discharge space 50, and a region including the through hole 14, the through hole 15, and a part of the buffer space 9 on the shield dielectric film 8 in the auxiliary dielectric space is defined as the auxiliary discharge space 58.

The auxiliary discharge space 58 can be generated by using the bottom surface region of the buffer space 9 under the shield dielectric film 8 as a ground electrode conductive film set to a ground potential and applying a discharge voltage between the electrode conductive film 31 that receives an AC voltage from the AC power supply 1 and the ground electrode conductive film.

As described above, the auxiliary discharge space 58 includes the through hole 14, the through hole 15, and a part of the buffer space 9. As described above, the discharge space 5 formed in the first embodiment includes a main discharge space 50 and an auxiliary discharge space 58.

In the active gas generation apparatus 51 of the first embodiment, a path leading from the auxiliary discharge space 58 to each of the gas ejection ports 61 and 62 is defined as an active gas flow path.

Figure 2:
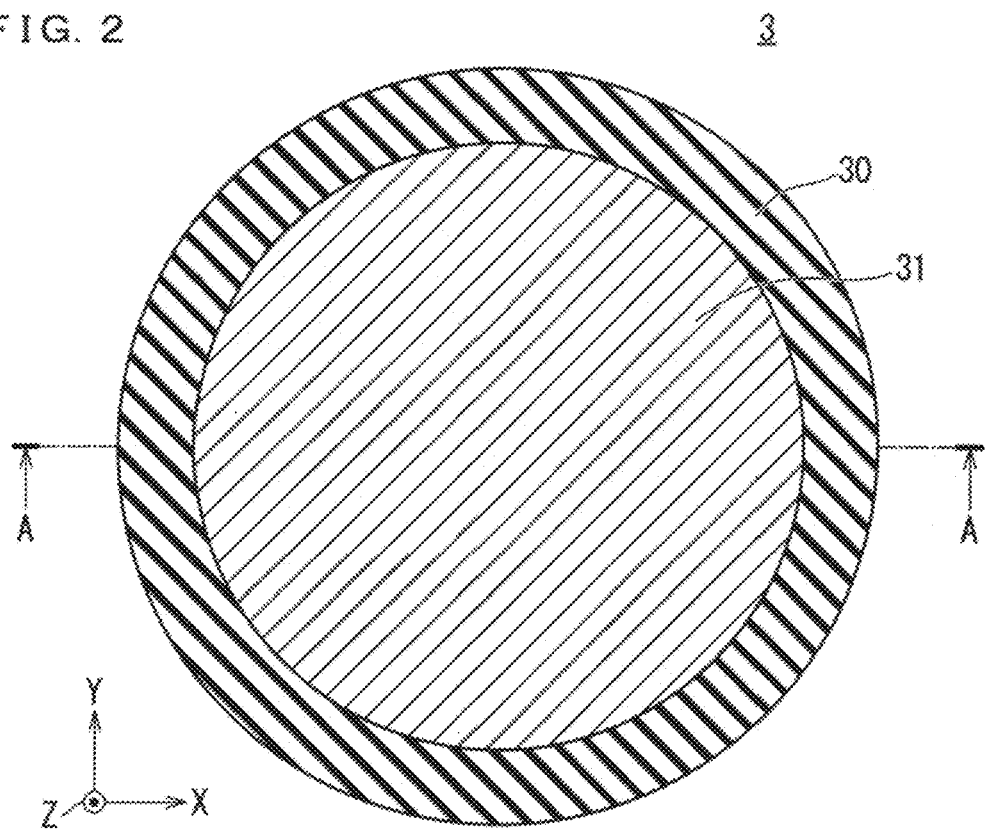
FIG. 2 is a plan view showing a planar structure of the high-voltage application electrode unit shown in FIG. 1.

FIG. 2 is a plan view showing a planar structure of the high-voltage application electrode unit 3. An XYZ orthogonal coordinate system is shown in FIG. 2. A cross section taken along line A-A in FIG. 2 is the structure of the high-voltage application electrode unit 3 shown in FIG. 1.

As shown in the figure, each of the electrode dielectric film 30 and the electrode conductive film 31 exhibits a circular shape in a plan view, and the electrode conductive film 31 is provided on the upper surface of the electrode dielectric film 30 in a mode in which the respective center positions of the electrode dielectric film 30 and the electrode conductive film 31 are matched with each other. Since the diameter of the electrode conductive film 31 is set slightly shorter than the diameter of the electrode dielectric film 30, the formation area of the electrode conductive film 31 is smaller than the formation area of the electrode dielectric film 30.

Figure 3:
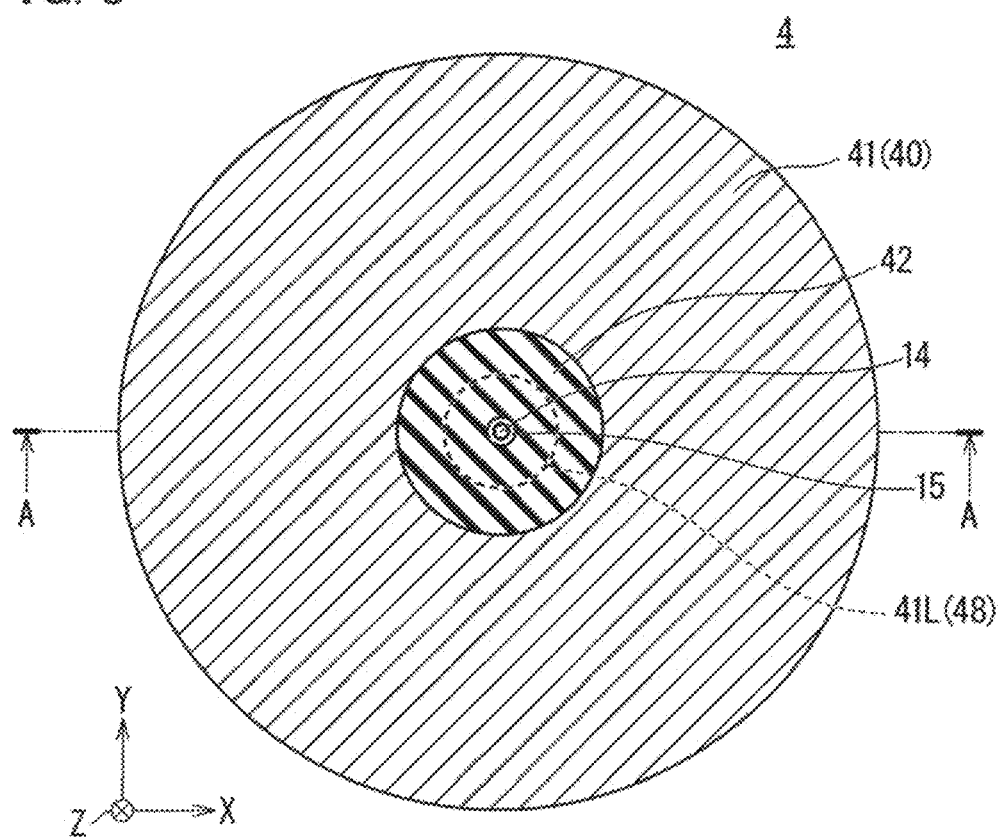
FIG. 3 is a plan view showing a planar structure of the ground potential electrode unit shown in FIG. 1.

FIG. 3 is a plan view showing a planar structure of the ground potential electrode unit 4. An XYZ orthogonal coordinate system is shown in FIG. 3. A cross section taken along line A-A in FIG. 3 is the structure of the ground potential electrode unit 4 shown in FIG. 1.

As shown in the figure, each of the electrode dielectric film 40 and the electrode conductive film 41 exhibits a circular shape in a plan view. However, the electrode dielectric film 40 has a through hole 14 being a circular dielectric through hole in a plan view at the center, and the electrode conductive film 41 has an opening 48 being a circular conductive film opening in a plan view at the center.

Each of the through hole 14 and the opening 48 overlaps the buffer space 9 in a plan view, and the opening 48 includes the through hole 14 in a plan view and exhibits a shape wider than the through hole 14.

The electrode conductive film 41 is provided on the lower surface of the electrode dielectric film 40 in a mode in which the respective center positions of the electrode dielectric film 40 and the electrode conductive film 41 are matched with each other. The diameter of the electrode conductive film 41 is set to be about the same as the diameter of the electrode dielectric film 40, but since the opening 48 wider than the through hole 14 is provided at the center, the formation area of the electrode conductive film 41 is smaller than the formation area of the electrode dielectric film 40. The opening 48 serves as a conductor opening.

The electrode boundary line 41L serving as an outer circumferential line having a circumferential shape of the opening 48 serves as an end portion on the through hole 14 side of the electrode conductive film 41, and the electrode conductive film 41 is not formed in a region inside the electrode boundary line 41L.

As shown in FIG. 3, the cover dielectric film 42 having a single structure is provided in a circular shape from on the lower surface of the electrode dielectric film 40 to on the lower surface of the electrode conductive film 41 including the electrode boundary line 41L. However, the cover dielectric film 42 has a through hole 15 being a cover through hole at the center.

The through hole 15 includes the through hole 14 and has a shape wider than the through hole 14, and the through hole 15 is included in the opening 48 and has a shape narrower than the opening 48. Therefore, the cover dielectric film 42 covers the electrode boundary line 41L of the electrode conductive film 41.

As shown in FIG. 3, the through hole 15 includes the entire through hole 14 having a circular shape in a plan view, and is provided in a circular shape wider than the through hole 14.

Figure 4:
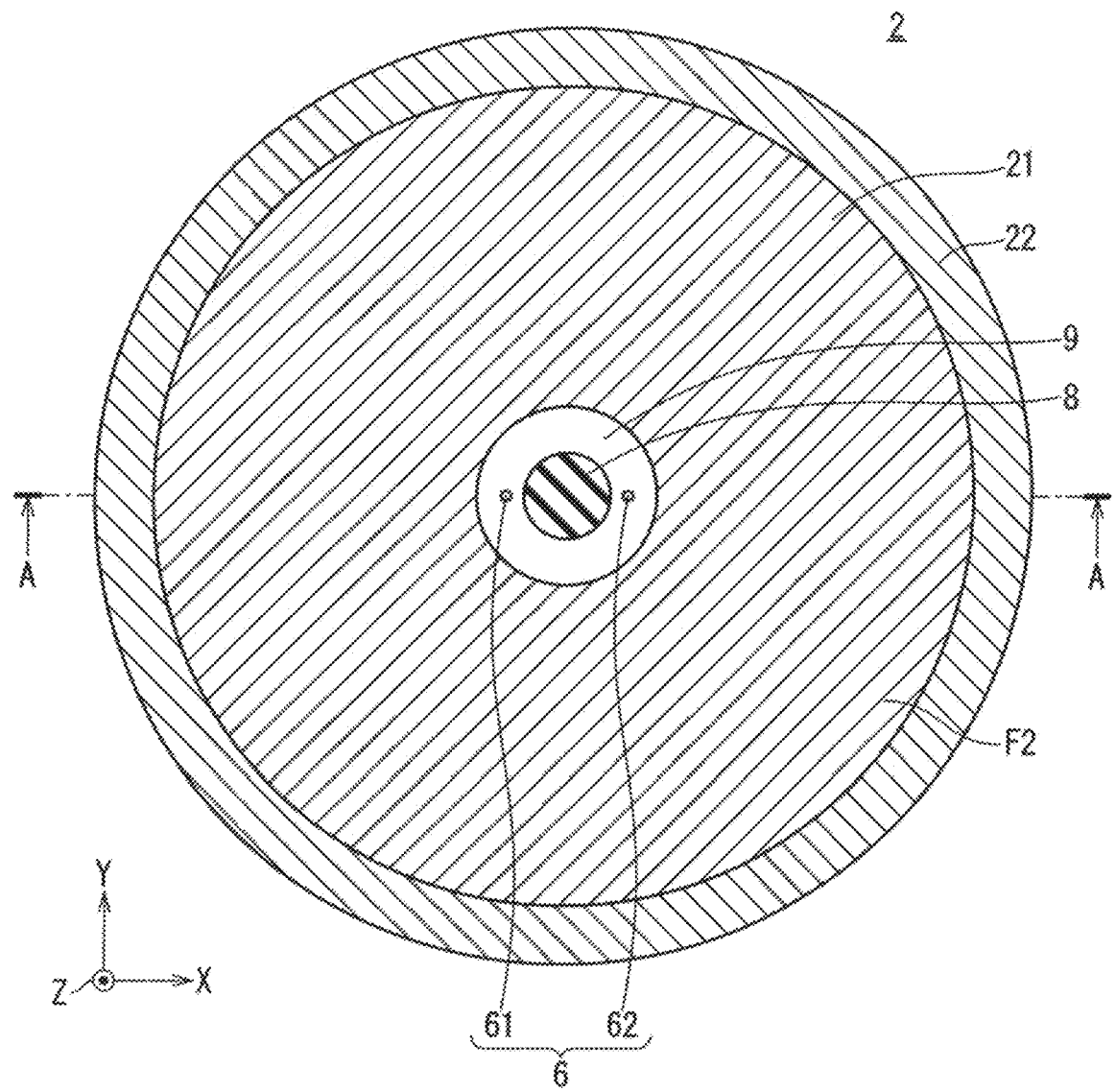
FIG. 4 is a plan view showing a planar structure of the housing bottom surface in the metal housing shown in FIG. 1.

FIG. 4 is a plan view showing a planar structure of the housing bottom surface 21 in the metal housing 2. An XYZ orthogonal coordinate system is shown in FIG. 4. A cross section taken along line A-A in FIG. 4 is the structure of the metal housing 2 shown in FIG. 1.

As shown in the figure, the metal housing 2 has a housing bottom surface 21 having a circular shape and a housing side surface 22 erected in a height direction from a peripheral region of the housing bottom surface 21. Each of the buffer space 9 and the shield dielectric film 8 exhibits a circular shape in a plan view, and the shield dielectric film 8 is provided on the bottom surface of the buffer space 9 in a mode in which the respective center positions of the buffer space 9 and the shield dielectric film 8 are matched with each other. Since the diameter of the shield dielectric film 8 is shorter than the diameter of the buffer space 9, the formation area of the shield dielectric film 8 is smaller than the formation area of the bottom surface of the buffer space 9, and the peripheral region of the shield dielectric film 8 is a region where the bottom surface of the buffer space 9 is exposed.

As shown in the figure, the gas ejection ports 61 and 62 are provided in a peripheral region of the shield dielectric film 8 through the bottom surface of the buffer space 9. The gas ejection ports 61 and 62 are provided symmetrically along the X direction across the shield dielectric film 8, and each function as an orifice. The "orifice" means a function of providing a pressure difference between the processing space 10 at the subsequent stage (below) of the active gas generation apparatus 51 and the discharge space 5 to sufficiently lower the pressure of the processing space 10.

In the active gas generation apparatus 51 of the first embodiment having this structure, the source gas G1 is supplied from the outside of the metal housing 2 into the in-housing space S2 through a supply port (not shown), and is supplied to the discharge space 5 as indicated by a broken arrow in FIG. 1. Specifically, the source gas G1 is supplied from the entire outer periphery of the electrode structure.

When the source gas G1 is supplied to the discharge space 5 where the dielectric barrier discharge is generated, the source gas G1 is activated to become an active gas G2, and is introduced into the buffer space 9 through the through hole 14 and the through hole 15 in the auxiliary discharge space 58. The active gas G2 that has entered the buffer space 9 passes through the gas ejection ports 61 and 62 provided on the bottom surface of the buffer space 9 and is supplied to the processing space 10 at the subsequent stage.

It should be noted that as described above, the discharge space 5 for generating the active gas G2 includes the main discharge space 50 and the auxiliary discharge space 58.

The shield dielectric film 8 is provided so that the bottom surface of the buffer space 9 in the metal housing 2 and the auxiliary discharge space 58 do not have a contact relationship. Generally, a metal material tends to be easily ionized due to a discharge phenomenon as compared with an insulator, and when the housing bottom surface 21 and the auxiliary discharge space 58 have a contact relationship, there is a high possibility that metal ions generated on the housing bottom surface 21 due to the discharge phenomenon of the auxiliary discharge space 58 are mixed into the active gas G2.

In the active gas generation apparatus 51 of the first embodiment, by providing the shield dielectric film 8, regarding the housing bottom surface 21 of the metal housing 2, there is a structure in which the bottom surface of the buffer space 9 is not in contact with the auxiliary discharge space 58, so that a phenomenon in which metal ions are mixed into the active gas G2 is prevented.

In addition, the electric field intensity at the electrode boundary line 41L serving as the outer circumferential line of the opening 48 of the electrode conductive film 41 of the ground potential electrode unit 4 and the vicinity thereof is likely to be high. Thus, by providing the cover dielectric film 42 so as to cover the electrode boundary line 41L, it is possible to prevent the electrode boundary line 41L of the electrode conductive film 41 from being in contact with the auxiliary discharge space 58.

By adopting the electrode structure of the dielectric barrier discharge as described above, since the auxiliary discharge space 58 is formed in addition to the main discharge space 50, the active gas generation apparatus 51 of the first embodiment expands the volume of the discharge space 5, and expands the region of the discharge space 5 to a region relatively close to the gas ejection port group 6 functioning as an orifice.

Therefore, the inactive state time until the active gas G2 generated in the discharge space 5 is transferred from the auxiliary discharge space 58 to the gas ejection port group 6 through the buffer space 9 can be shortened. This is because the space volume of the active gas flow path from the auxiliary discharge space 58 to the gas ejection port group 6 can be reduced.

In accordance with reduction in the inactive state time, the possibility of occurrence of gas collisional deactivation due to collision between the source gas G1 and the active gas G2 or collision/reaction between the active gases G2 can be kept low.

In addition, since the active gas generation apparatus 51 does not include a region where the active gas flow path is intentionally narrowed as in the conventional active gas generation apparatus disclosed in Patent Document 1, there is no structure in which members constituting the active gas generation apparatus 51 and the active gas flow path are likely to come into contact with each other. Therefore, the active gas generation apparatus 51 of the first embodiment can keep the possibility of occurrence of surface deactivation low.

Effects (Including Description of First Modification)

In the active gas generation apparatus 51 of the first embodiment described above, the auxiliary discharge space 58 being a part of the discharge space 5 includes the through hole 14 being a dielectric through hole, the through hole 15 being a cover through hole, and a part of the buffer space 9. For this reason, the deactivation amount of the active gas can be suppressed by suppressing the active gas flow path from the auxiliary discharge space 58 of the discharge space 5 to each of the gas ejection ports 61 and 62 to the minimum necessary.

This point will be described in detail below. In the discharge space 5, the discharge in the main discharge space 50 is intended to discharge the source gas G1 that is not ionized, so that the applied voltage (effective value) of the AC voltage supplied from the AC power supply 1 needs to be set relatively high.

On the other hand, after the discharge phenomenon occurs in the main discharge space 50 to generate the active gas G2, a large number of ionized active gas G2, ionized source gas G1, and free electrons are present in the main discharge space 50, and thus the voltage for maintaining the discharge in the main discharge space 50 and the auxiliary discharge space 58 may be lower than the voltage required when the source gas G1 is intended to be discharged.

Therefore, with respect to the auxiliary discharge space 58, the distance (second gap length) in the height direction (Z direction) between the electrode dielectric film 30 and the shield dielectric film 8 is large, but since a large number of the active gases G2 and the free electrons are present, a discharge phenomenon occurs also in a region from the through hole 14 to above the shield dielectric film 8 in the auxiliary discharge space 58. That is, when an AC voltage that generates dielectric barrier discharge in the main discharge space 50 is applied from the AC power supply 1, dielectric barrier discharge can be maintained also in the auxiliary discharge space 58.

In addition, in the buffer space 9, the reason why the shape of the auxiliary discharge space 58 is widened in the horizontal direction is that the free electrons and the active gas G2 are widened in the periphery including the horizontal direction along the flow of the active gas G2.

For example, under the following discharge phenomenon setting conditions, a discharge phenomenon can be generated in the entire discharge space 5 including the main discharge space 50 and the auxiliary discharge space 58.

(1) Distance (first gap length) between electrode dielectric film 30 and electrode dielectric film 40 . . . 1 mm
(2) Distance (second gap length) between electrode dielectric film 30 and shield dielectric film 8 . . . 3.5 mm
(3) Applied voltage (effective value) from AC power supply 1 . . . 5000 V
(4) Type of source gas . . . nitrogen gas It should be noted that in the item (2), the second gap length can be obtained by {first gap length (1 mm)+film thickness (1 mm) of electrode dielectric film 40+film thickness (0.5 mm) of cover dielectric film 42±distance (1 mm) between cover dielectric film 42 and shield dielectric film 8=3.5 mm}.

Furthermore, the cover dielectric film 42 of the ground potential electrode unit 4 in the active gas generation apparatus 51 of the first embodiment covers the electrode boundary line 41L in the buffer space 9 and overlaps the gas ejection ports 61 and 62 in a plan view.

Therefore, the active gas generation apparatus 51 of the first embodiment can reliably avoid the surface deactivation phenomenon in which the active gas G2 disappears accompanying the active gas G2 in the buffer space 9 colliding with the electrode conductive film 41. In particular, it is possible to reliably avoid the surface deactivation phenomenon of the active gas G2 above the gas ejection ports 61 and 62 in the buffer space 9.

Figure 5:
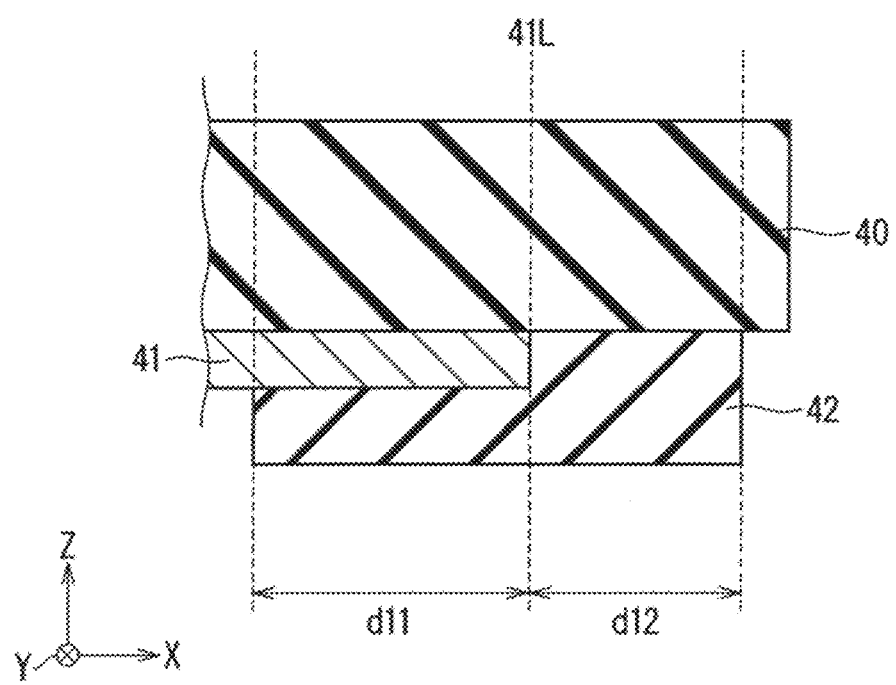
FIG. 5 is a cross-sectional view showing a cross-sectional structure around an electrode boundary line in the electrode conductive film shown in FIG. 1.

This point will be described in detail below. FIG. 5 is a cross-sectional view showing a cross-sectional structure around an electrode boundary line 41L of the electrode conductive film 41. An XYZ orthogonal coordinate system is shown in FIG. 5.

As shown in the figure, the cover dielectric film 42 is provided from on the lower surface of the electrode dielectric film 40 to a part on the lower surface of the electrode conductive film 41, and covers the electrode boundary line 41L. Here, a formation distance of the cover dielectric film 42 along the −X direction from the electrode boundary line 41L is defined as a distance d11, and a formation distance of the cover dielectric film 42 along the +X direction from the electrode boundary line 41L is defined as a distance d12.

The pressure in the buffer space 9 is 30 kPa (absolute pressure), and an AC voltage of 5000 V (effective value) is applied from the AC power supply 1 to the electrode conductive film 31. Then, the source gas G1 supplied to the discharge space 5 is nitrogen gas, the thicknesses of the electrode dielectric film 30 and the electrode dielectric film 40 are both 1 mm, and the distance (first gap length) in the height direction of the main dielectric space between the electrode dielectric film 30 and the electrode dielectric film 40 is set to 2 mm to 3 mm. In this case, the distance d11 is desirably set to 2 mm or more, and the distance d12 is desirably set to 0.2 mm or more.

With regard to the coating characteristics on the electrode conductive film 41 due to the cover dielectric film 42, the surface deactivation phenomenon can be reliably avoided by setting the distance d11 and the distance d12 as described above.

As a result, the active gas generation apparatus 51 of the first embodiment can exhibit a high-concentration gas supply effect capable of supplying the high concentration active gas G2 from the gas ejection port group 6 to the processing space 10 at the subsequent stage.

Furthermore, since the electrode structure in the active gas generation apparatus 51 of the first embodiment does not include conductive films other than the electrode conductive films 31 and 41, it is not necessary to process the electrode dielectric film 30 as in the conventional active gas generation apparatus disclosed in Patent Document 1, so that it is possible to exhibit a configuration simplification effect of allowing configuration at low cost.

In addition, the active gas generation apparatus 51 of the first embodiment is provided with the gas ejection ports 61 and 62 at a quantity ratio of 1:2 (=N) with respect to the buffer space 9. That is, two gas ejection ports 61 and 62 are provided for one buffer space 9. Therefore, as compared with a structure in which the gas ejection ports are provided at a quantity ratio of 1:1 with respect to the buffer space, the generation of the gas reservoir region 28 in which the active gas G2 stagnates in the buffer space 9 can be suppressed.

Figure 6:
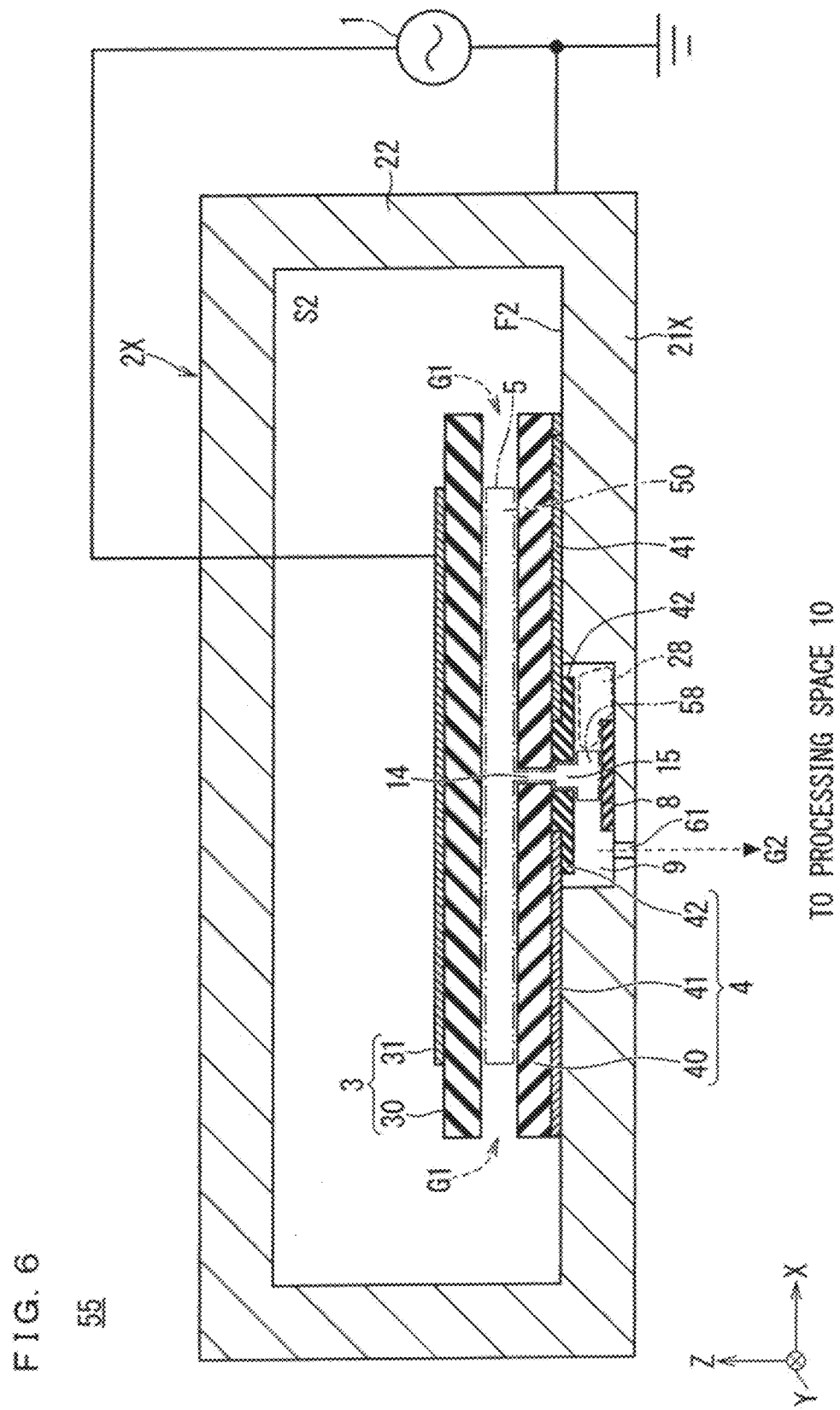
FIG. 6 is an explanatory diagram showing a cross-sectional structure of an active gas generation apparatus of a first modification of the first embodiment.
Figure 7:
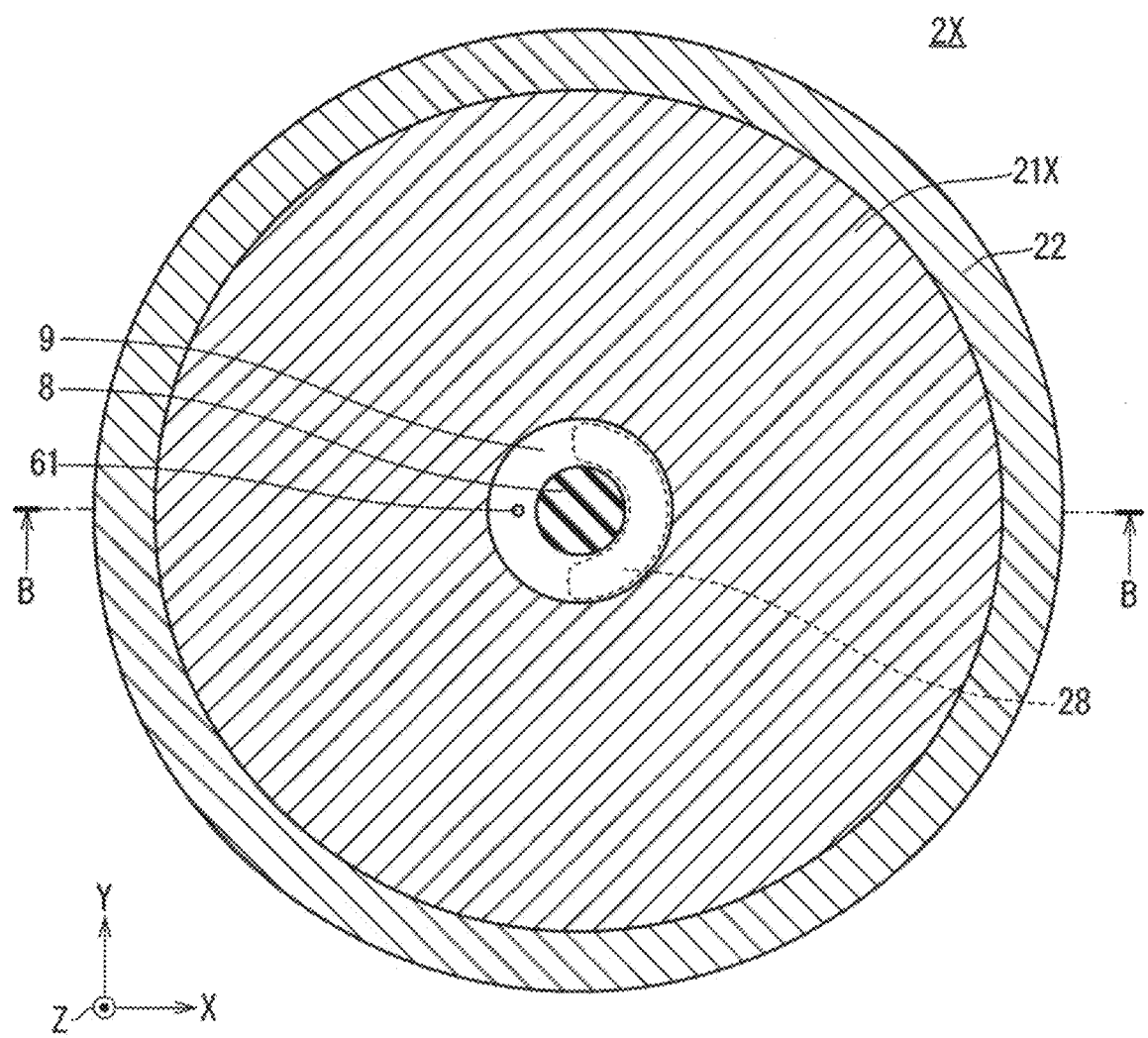
FIG. 7 is a plan view showing a planar structure of the housing bottom surface in the metal housing of the first modification.

This point will be described in detail below. FIG. 6 is an explanatory diagram schematically showing a cross-sectional structure of an active gas generation apparatus 55 of a first modification of the first embodiment. FIG. 7 is a plan view showing a planar structure of the housing bottom surface 21 in the metal housing 2X of the first modification. An XYZ orthogonal coordinate system is shown in each of FIGS. 6 and 7. A cross section taken along line B-B in FIG. 7 is the structure of the metal housing 2X shown in FIG. 6.

As shown in these figures, the active gas generation apparatus 55 of the first modification is different from the active gas generation apparatus 51 of the first embodiment in that only the gas ejection port 61 is provided in the buffer space 9 on the housing bottom surface 21X of the metal housing 2X. As described above, the active gas generation apparatus 55 includes the gas ejection port 61 at a ratio of 1:1 to the buffer space 9.

As shown in these figures, since the active gas generation apparatus 55 being the first modification is formed with only the gas ejection port 61, a space relatively away from the gas ejection port 61 in the buffer space 9 serves as the gas reservoir region 28.

The reason why the gas reservoir region 28 is generated is that the active gas G2 accumulates in the gas reservoir region 28 relatively away from the gas ejection port 61 as the flow velocity of the active gas G2 becomes slower.

On the other hand, the active gas generation apparatus 51 of the first embodiment includes the gas ejection ports 61 and 62 at a ratio of 1:2 to the buffer space 9.

Therefore, by providing the gas ejection port 62 in a region corresponding to the gas reservoir region 28 of the active gas generation apparatus 55, the active gas generation apparatus 51 of the first embodiment can eject the active gas G2 from the gas ejection port 62 to the processing space 10 below. Therefore, the gas reservoir region 28 as in the active gas generation apparatus 55 of the first modification is not generated.

As a result, since capable of suppressing the generation of the gas reservoir region 28, the active gas generation apparatus 51 of the first embodiment can supply the active gas G2 to the processing space 10 at the subsequent stage in a stable supply amount.

It should be noted that in the active gas generation apparatus 51 of the first embodiment, as the quantity ratio of 1:N, a case of {N=2} is shown, but it is needless to say that an extended configuration in which N is set to "3" or more is possible.

In addition, also in the active gas generation apparatus 55 being the first modification, as in the active gas generation apparatus 51, the above-described high-concentration gas supply effect and configuration simplification effect can be exhibited.

(Second Modification)

Figure 8:
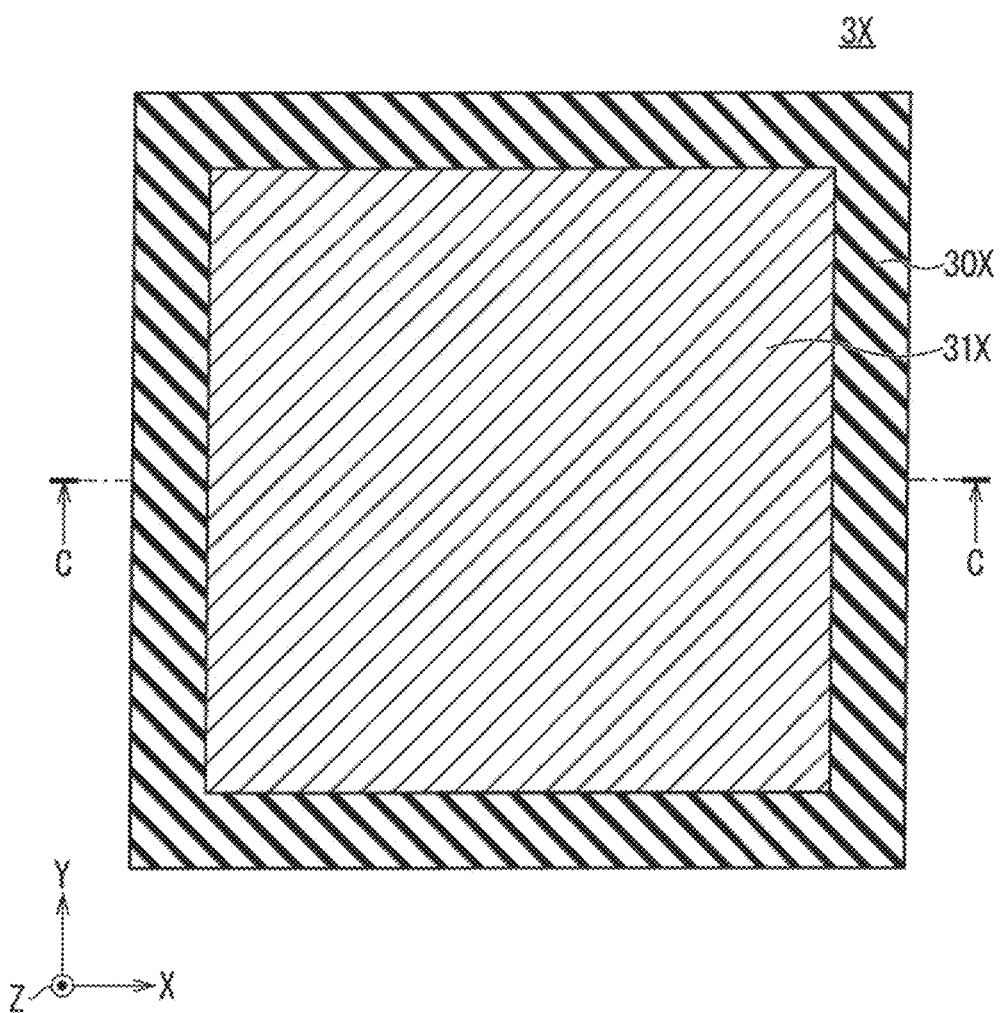
FIG. 8 is a plan view showing a planar structure of a high-voltage application electrode unit of a second modification of the first embodiment.
Figure 9:
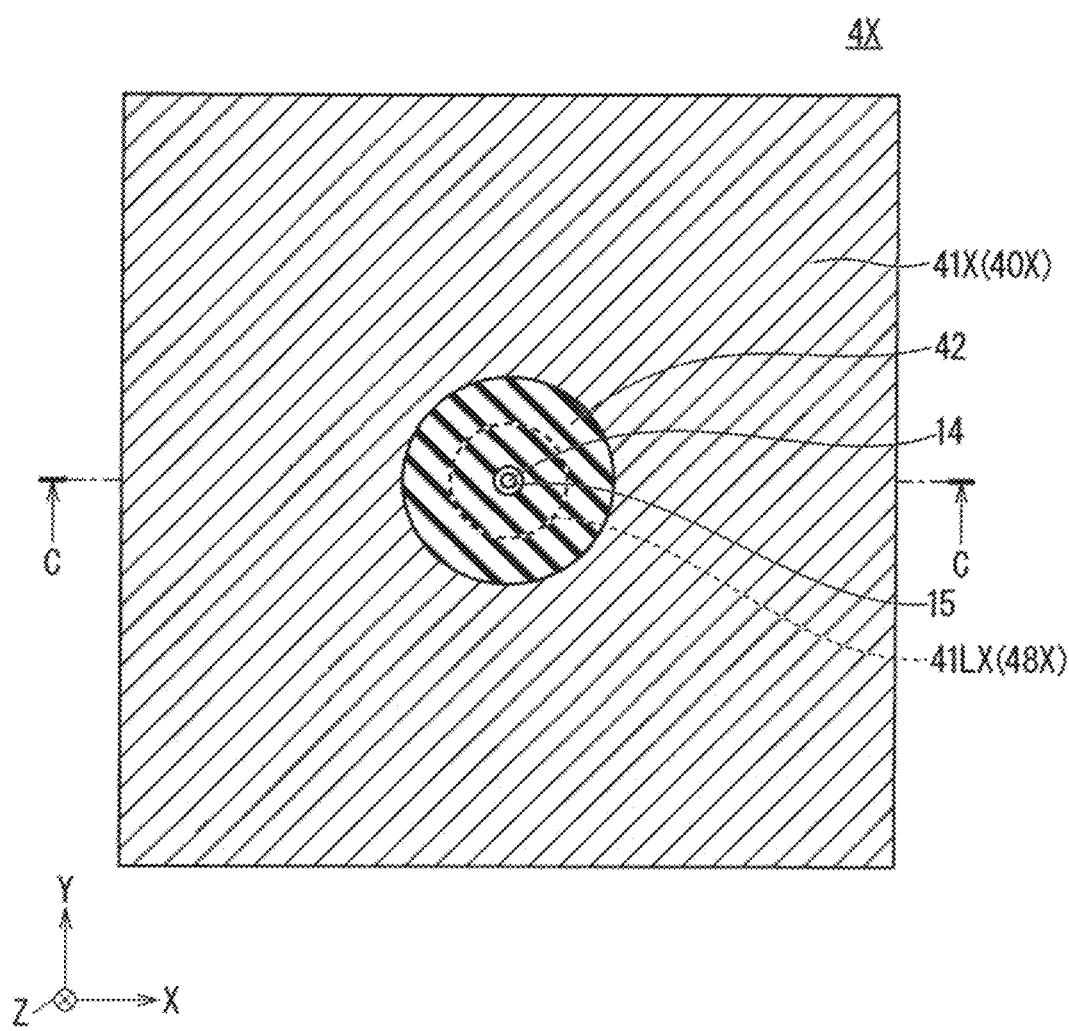
FIG. 9 is a plan view showing a planar structure of a ground potential electrode unit of the second modification of the first embodiment.

FIG. 8 is a plan view showing a planar structure of a high-voltage application electrode unit 3X of an active gas generation apparatus [51] 51X being a second modification of the first embodiment. FIG. 9 is a plan view showing a planar structure of the ground potential electrode unit 4X of the active gas generation apparatus 51X. An XYZ orthogonal coordinate system is shown in each of FIGS. 8 and 9. A cross section taken along line C-C in FIG. 8 has a cross-sectional structure similar to that of the high-voltage application electrode unit 3 of the active gas generation apparatus 51 shown in FIG. 1. A cross section taken along line C-C in FIG. 9 has a cross-sectional structure similar to that of the ground potential electrode unit 4 of the active gas generation apparatus 51 shown in FIG. 1.

It should be noted that the metal housing 2 houses an electrode structure including the high-voltage application electrode unit 3X and the ground potential electrode unit 4X in the in-housing space S2, and exhibits a planar structure similar to that of the first embodiment shown in FIG. 4.

Hereinafter, with reference to FIGS. 8 and 9, the description of the parts common to the active gas generation apparatus 51 of the first embodiment shown in FIGS. 1 to 5 will be appropriately omitted, and the description will be focused on the feature places of the active gas generation apparatus 51X being the second modification.

As shown in FIG. 8, each of the electrode dielectric film 30X and the electrode conductive film 31X exhibits a square shape in a plan view, and the electrode conductive film 31X is provided on the upper surface of the electrode dielectric film 30X in a mode in which the respective center positions of the electrode dielectric film 30X and the electrode conductive film 31X are matched with each other. Since the length of one side of the electrode conductive film 31X is set slightly shorter than the length of one side of the electrode dielectric film 30X, the formation area of the electrode conductive film 31X is smaller than the formation area of the electrode dielectric film 30X.

As shown in FIG. 9, each of the electrode dielectric film 40X and the electrode conductive film 41X exhibits a square shape in a plan view. However, the electrode dielectric film 40X has a through hole 14 being a circular dielectric through hole at the center, and the electrode conductive film 41X has an opening 48X being a circular conductive film opening at the center.

Each of the through hole 14 and the opening 48X overlaps the buffer space 9 in a plan view, and the opening 48X includes the through hole 14 in a plan view and exhibits a shape wider than the through hole 14.

The electrode conductive film 41X is provided on the lower surface of the electrode dielectric film 40X in a mode in which the respective center positions of the electrode dielectric film 40X and the electrode conductive film 41X are matched with each other. The length of one side of the electrode conductive film 41X is set to be about the same as the length of one side of the electrode dielectric film 40X, but since the opening 48X wider than the through hole 14 is provided at the center, the formation area of the electrode conductive film 41X is smaller than the formation area of the electrode dielectric film 40X. The opening 48X serves as a conductor opening.

The electrode boundary line 41LX serving as an outer circumferential line having a circumferential shape of the opening 48X serves as an end portion on the through hole 14 side of the electrode conductive film 41X, and the electrode conductive film 41X is not formed in a region inside the electrode boundary line 41LX.

As shown in FIG. 9, the cover dielectric film 42 having a single structure is provided in a circular shape from on the lower surface of the electrode dielectric film 40X to on the lower surface of the electrode conductive film 41X including the electrode boundary line 41LX. However, the cover dielectric film 42 has a through hole 15 being a cover through hole at the center. As described above, the cover dielectric film 42 covers the electrode boundary line 41LX of the electrode conductive film 41X.

The through hole 15 includes the through hole 14 and has a shape wider than the through hole 14, and the through hole 15 is included in the opening 48X and has a shape narrower than the opening 48X. Therefore, the cover dielectric film 42 covers the electrode boundary line 41LX of the electrode conductive film 41X.

As shown in FIG. 9, the through hole 15 includes the entire through hole 14 having a circular shape in a plan view, and is provided in a circular shape wider than the through hole 14.

As described above, the active gas generation apparatus 51X of the second modification includes: an electrode structure including the high-voltage application electrode unit 3X including the electrode dielectric film 30X and the electrode conductive film 31X each having a square shape in a plan view, and the ground potential electrode unit 4X including the electrode dielectric film 40X and the electrode conductive film 41X each having a square shape in a plan view.

It should be noted that the planar shape of the buffer space 9 is desirably formed in a circular shape similarly to that of the active gas generation apparatus 51 of the first embodiment shown in FIG. 4.

Also in the active gas generation apparatus 51X of the second modification having this configuration, as in the active gas generation apparatus 51 of the first embodiment, the high-concentration gas supply effect and configuration simplification effect can be exhibited.

In addition, since the active gas generation apparatus 51X of the second modification is provided with the gas ejection ports 61 and 62 at a quantity ratio of 1:2 (N=2) with respect to the buffer space 9 as with the active gas generation apparatus 51, the active gas generation apparatus 51X can suppress the generation of the gas reservoir region 28, and thus, the active gas generation apparatus 51X can supply the active gas G2 to the processing space 10 at the subsequent stage in a stable supply amount.

It should be noted that in the second modification, it is also theoretically conceivable to have a mode of making the shapes the cover dielectric film 42 and the buffer space 9 a square shape.

Second Embodiment

Figure 10:
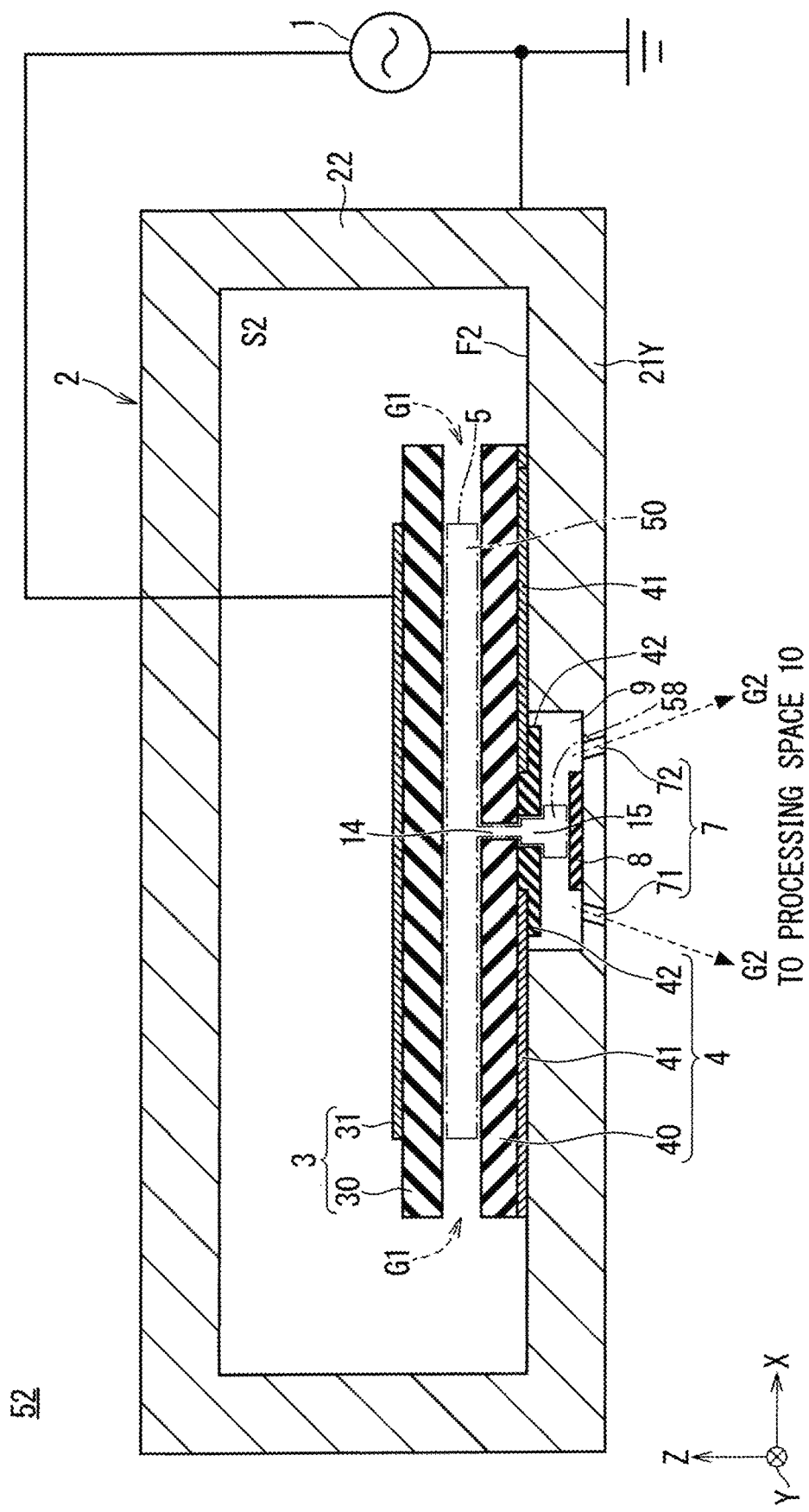
FIG. 10 is an explanatory diagram showing a cross-sectional structure of an active gas generation apparatus of a second embodiment.

FIG. 10 is an explanatory diagram schematically showing a cross-sectional structure of an active gas generation apparatus 52 of a second embodiment. An XYZ orthogonal coordinate system is shown in FIG. 10.

Hereinafter, with reference to FIG. 10, portions common to those of the active gas generation apparatus 51 of the first embodiment shown in FIGS. 1 to 5 will be denoted by the same reference numerals and description thereof will be omitted as appropriate, and the description will be focused on the feature places of the active gas generation apparatus 52 of the second embodiment.

As shown in the figure, the gas ejection ports 71 and 72 are provided in a peripheral region of the shield dielectric film 8 on the bottom surface of the buffer space 9. The gas ejection ports 71 and 72 are provided symmetrically across the shield dielectric film 8, and each function as an orifice. Hereinafter, the combination of the gas ejection ports 71 and 72 may be referred to as a "gas ejection port group 7".

Each of the gas ejection ports 71 and 72 has an oblique structure directed downward and inclined toward the horizontal direction. The gas ejection port 71 has an oblique structure directed downward and inclined toward the −X direction, and the gas ejection port 72 has an oblique structure directed downward and inclined toward the +X direction. Both the gas ejection ports 71 and 72 overlap the cover dielectric film 42 in a plan view, and neither of them overlaps the through hole 14 and the through hole 15 in a plan view.

In the active gas generation apparatus 52 of the second embodiment having this configuration, when the source gas G1 is supplied to the discharge space 5 where the dielectric barrier discharge occurs, the source gas G1 is activated to become the active gas G2, and is introduced into the buffer space 9 through the through hole 14 and the through hole 15 in the auxiliary discharge space 58. The active gas G2 that has entered the buffer space 9 passes through the gas ejection port group 7 (71, 72) functioning as an orifice provided on the bottom surface of the buffer space 9 and is supplied to the processing space 10 at the subsequent stage.

Since each of the gas ejection ports 71 and 72 of the active gas generation apparatus 52 of the second embodiment has an oblique structure, the active gas G2 can be supplied in multiple directions to the processing space 10 at the subsequent stage, and thus, the uniformity of the concentration of the active gas G2 can be enhanced.

It should be noted that the active gas generation apparatus 52 of the second embodiment also has the high-concentration gas supply effect and the configuration simplification effect as in the active gas generation apparatus 51 of the first embodiment.

Furthermore, since provided with the gas ejection ports 71 and 72 at a quantity ratio of 1:2 (=N) with respect to the buffer space 9, as in the first embodiment, the active gas generation apparatus 52 of the second embodiment can suppress the generation of the gas reservoir region 28, and supply the active gas G2 to the processing space 10 at the subsequent stage in a stable supply amount.

Third Embodiment

Figure 11:
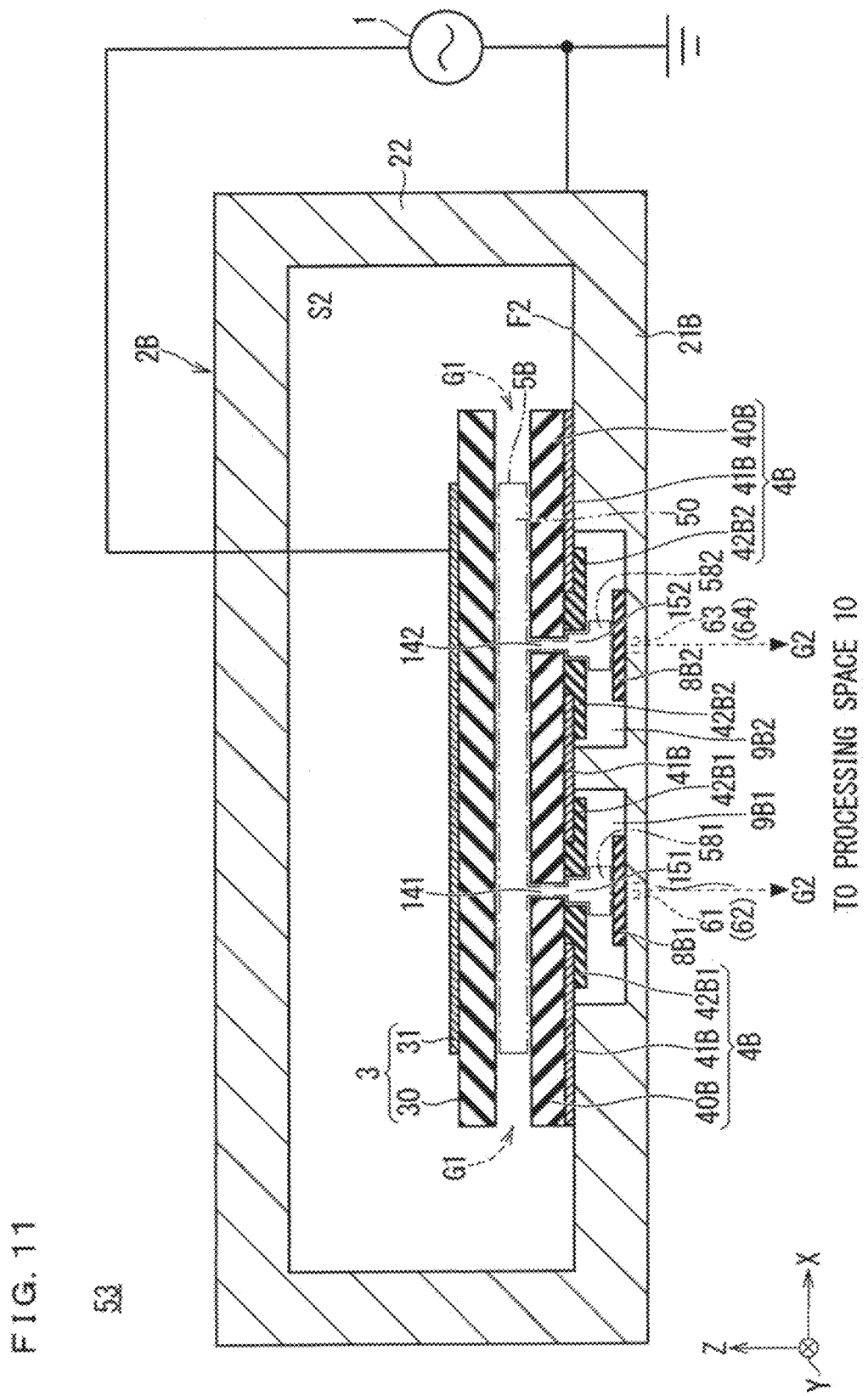
FIG. 11 is an explanatory diagram showing a cross-sectional structure of an active gas generation apparatus of a third embodiment.
Figure 12:
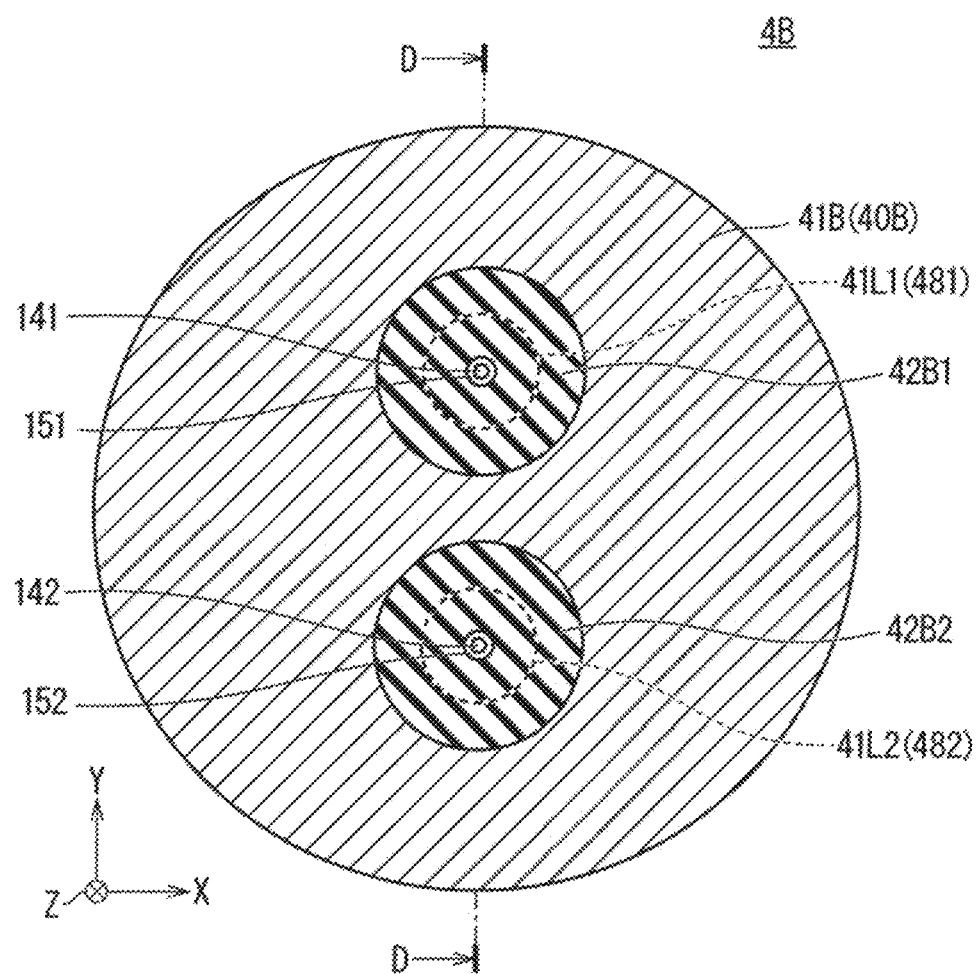
FIG. 12 is a plan view showing a planar structure of the ground potential electrode unit shown in FIG. 11.
Figure 13:
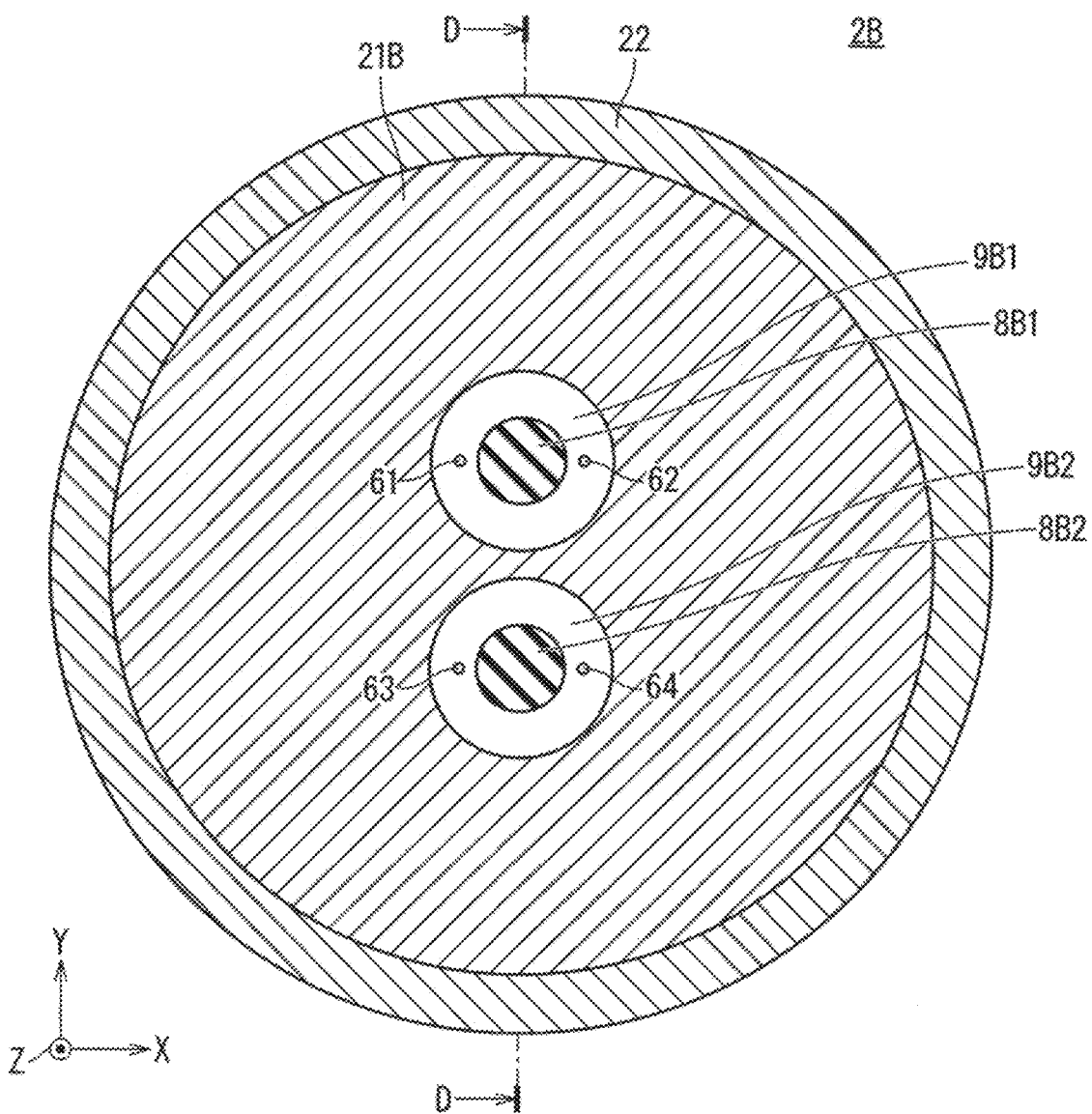
FIG. 13 is a plan view showing a planar structure of the housing bottom surface in the metal housing shown in FIG. 11.

FIG. 11 is an explanatory diagram schematically showing a cross-sectional structure of an active gas generation apparatus 53 of a third embodiment in the present disclosure. FIG. 12 is a plan view showing a planar structure of the ground potential electrode unit 4B. FIG. 13 is a plan view showing a planar structure of the housing bottom surface 21B in the metal housing 2B. An XYZ orthogonal coordinate system is shown in each of FIGS. 11 to 13. A cross section taken along line D-D in FIG. 12 is the structure of the ground potential electrode unit 4B shown in FIG. 11, and a cross section taken along line D-D in FIG. 13 is the structure of the metal housing 2B shown in FIG. 11.

Hereinafter, with reference to FIGS. 11 to 13, portions common to those of the active gas generation apparatus 51 of the first embodiment shown in FIGS. 1 to 5 will be denoted by the same reference numerals and description thereof will be omitted as appropriate, and the description will be focused on the feature places of the active gas generation apparatus 53 of the third embodiment.

The active gas generation apparatus 53 of the third embodiment includes a metal housing 2B, an electrode structure, an AC power supply 1, and shield dielectric films 8B1 and 8B2 as main components.

The metal housing 2B is a housing surrounding the in-housing space S2, and includes a housing bottom surface 21B and a housing side surface 22. The housing bottom surface 21B has a bottom surface structure including a flat surface F2 and two buffer spaces 9B1 and 9B2 each recessed in a depth direction from the flat surface F2. The buffer spaces 9B1 and 9B2 are provided to be separated from each other across the flat surface F2 of the housing bottom surface 21B.

On the other hand, the electrode structure includes a high-voltage application electrode unit 3 and a ground potential electrode unit 4B as main components, and is disposed on the housing bottom surface 21B of the metal housing 2B so as to close the buffer spaces 9B1 and 9B2.

Hereinafter, the electrode structure of the third embodiment will be described in detail. The electrode structure includes a high-voltage application electrode unit 3 being a first electrode component, and a ground potential electrode unit 4B being a second electrode component provided below the high-voltage application electrode unit 3.

The ground potential electrode unit 4B being the second electrode component includes an electrode dielectric film 40B being a second electrode dielectric film, an electrode conductive film 41B being a second electrode conductive film formed on the lower surface of the electrode dielectric film 40B, and cover dielectric films 42B1 and 42B2.

The cover dielectric film 42B1 being the first cover dielectric film is provided on the lower surfaces of the electrode dielectric film 40B and the electrode conductive film 41B in the buffer space 9B1, and the cover dielectric film 42B2 being the second cover dielectric film is provided on the lower surfaces of the electrode dielectric film 40B and the electrode conductive film 41B in the buffer space 9B2.

The electrode dielectric film 40B and the cover dielectric films 42B1 and 42B2 have dielectrics as constituent materials, and the electrode conductive film 41B has a conductor such as metal as a constituent material.

The electrode structure is disposed on the bottom surface of the metal housing 2B in a mode that the electrode conductive film 41B and the flat surface F2 on the housing bottom surface 21B of the metal housing 2B are in contact with each other.

The electrode dielectric film 40B has through holes 141 and 142 being first and second dielectric through holes, and the through holes 141 and 142 are provided to penetrate the electrode dielectric film 40B. The through hole 141 overlaps the buffer space 9B1 in a plan view, and the through hole 142 overlaps the buffer space 9B2 in a plan view.

The cover dielectric film 42B1 being the first cover dielectric film has a through hole 151 in a region overlapping the through hole 141 in a plan view. The cover dielectric film 42B2 being the second cover dielectric film has a through hole 152 in a region overlapping the through hole 142 in a plan view. The through hole 151 being the first cover through hole is provided to penetrate the cover dielectric film 42B1, and the through hole 152 being the second cover through hole is provided to penetrate the cover dielectric film 42B2. In addition, the through hole 151 overlaps the buffer space 9B1 in a plan view, and the through hole 152 overlaps the buffer space 9B2 in a plan view.

On the bottom surface of the buffer space 9B1, the shield dielectric film 8B1 being the first shield dielectric film includes a region overlapping the through hole 141 and the through hole 151 in a plan view, and has a shape wider than each of the through hole 141, the through hole 151, and the opening 481. Similarly, on the bottom surface of the buffer space 9B2, the shield dielectric film 8B2 being the second shield dielectric film includes a region overlapping the through hole 142 and the through hole 152 in a plan view, and has a shape wider than each of the through hole 142 and the through hole 152.

The housing bottom surface 21B of the metal housing 2B has two gas ejection ports 61 and 62 provided to penetrate the bottom surface of the buffer space 9B1 in the peripheral region of the shield dielectric film 8B1 being the first shield dielectric film. Both the gas ejection ports 61 and 62 are classified as the first gas ejection ports provided on the bottom surface of the buffer space 9B1 being the first buffer space.

The housing bottom surface 21B of the metal housing 2B has two gas ejection ports 63 and 64 provided to penetrate the bottom surface of the buffer space 9B2 in the peripheral region of the shield dielectric film 8B2 being the second shield dielectric film. Both the gas ejection ports 63 and 64 are classified as the second gas ejection ports provided on the bottom surface of the buffer space 9B2 being the second buffer space.

Both the gas ejection ports 61 and 62 overlap the cover dielectric film 42B1 in a plan view, and neither of them overlaps the through hole 141 and the through hole 151 in a plan view. Similarly, both the gas ejection ports 63 and 64 overlap the cover dielectric film 42B2 in a plan view, and neither of them overlaps the through hole 142 and the through hole 152 in a plan view. Hereinafter, the combination of the gas ejection ports 61 and 62 may be referred to as a "first gas ejection port group", and the combination of the gas ejection ports 63 and 64 may be referred to as a "second gas ejection port group".

An AC voltage is applied as an applied voltage from the AC power supply 1 to the electrode conductive film 31, and a setting potential being a reference potential is assigned to the electrode conductive film 41B being the second electrode conductive film through the housing bottom surface 21B of the metal housing 2B.

In the active gas generation apparatus 53 of the third embodiment having this configuration, a space in which the electrode dielectric film 30 and the electrode dielectric film 40B face each other is defined as a main dielectric space. In addition, a space where the electrode dielectric film 30 and the shield dielectric film 8B1 face each other is defined as a first auxiliary dielectric space, and a space where the electrode dielectric film 30 and the shield dielectric film 8B2 face each other is defined as a second auxiliary dielectric space.

A region where the electrode conductive films 31 and 41B overlap in a plan view in the main dielectric space is defined as the main discharge space 50.

A region including the through hole 141 and the through hole 151 in the first auxiliary dielectric space is defined as an auxiliary discharge space 581. The auxiliary discharge space 581 serves as a first auxiliary discharge space. A region including the through hole 142 and the through hole 152 in the second auxiliary dielectric space is defined as an auxiliary discharge space 582. The auxiliary discharge space 582 serves as a second auxiliary discharge space. The auxiliary discharge spaces 581 and 582 being the first and second auxiliary discharge spaces are separated from each other.

The auxiliary discharge space 581 further includes a part of the buffer space 9B1 above the shield dielectric film 8B1, and a path leading from the auxiliary discharge space 581 to each of the gas ejection ports 61 and 62 in the buffer space 9B1 is defined as a first active gas flow path. Therefore, the active gas G2 generated in the discharge space 5B is ejected from the gas ejection ports 61 and 62 toward the processing space 10 through the first active gas flow path in the buffer space 9B1. As described above, the gas ejection ports 61 and 62 serve as the first gas ejection port group.

Similarly, the auxiliary discharge space 582 further includes a part of the buffer space 9B2 above the shield dielectric film 8B2, and a path from the auxiliary discharge space 582 to each of the gas ejection ports 63 and 64 in the buffer space 9B2 is defined as a second active gas flow path. Therefore, the active gas G2 generated in the discharge space 5B is ejected from the gas ejection ports 63 and 64 toward the processing space 10 through the second active gas flow path in the buffer space 9B2. As described above, the gas ejection ports 63 and 64 serve as the [first] second gas ejection port group.

As described above, the discharge space 5B in the active gas generation apparatus 53 of the third embodiment includes the main discharge space 50, the auxiliary discharge space 581, and the auxiliary discharge space 582, and the first and second active gas flow paths are completely separated from each other.

As shown in FIG. 12, each of the electrode dielectric film 40B and the electrode conductive film 41B exhibits a circular shape in a plan view. However, the electrode dielectric film 40B has through holes 141 and 142 serving as circular first and second dielectric through holes in a plan view, and the electrode conductive film 41B has openings 481 and 482 serving as circular first and second conductive film openings in a plan view.

Each of the through hole 141 and the opening 481 overlaps the buffer space 9B1 in a plan view, and the opening 481 includes the through hole 141 in a plan view and exhibits a shape wider than the through hole 141. Similarly, each of the through hole 142 and the opening 482 overlaps the buffer space 9B2 in a plan view, and the opening 482 includes the through hole 142 in a plan view and exhibits a shape wider than the through hole 142.

As shown in FIG. 12, the through holes 141 and 142 are arranged along the Y direction, and the through holes 151 and 152 are arranged to surround the through holes 141 and 142 along the Y direction.

The electrode conductive film 41B is provided on the lower surface of the electrode dielectric film 40B in a mode in which the respective center positions of the electrode dielectric film 40B and the electrode conductive film 41B are matched with each other. The diameter of the electrode conductive film 41B is set to be about the same as the diameter of the electrode dielectric film 40B, but since the openings 481 and 482 wider than the through holes 141 and 142 are provided, the formation area of the electrode conductive film 41B is smaller than the formation area of the electrode dielectric film 40B. The openings 481 and 482 serve as the first and second conductor openings.

The electrode boundary line 41L1 serving as an outer circumferential line having a circumferential shape of the opening 481 being the first conductive film opening serves as an end portion on the through hole 141 side of the electrode conductive film 41B, and the electrode conductive film 41B is not formed in a region inside the electrode boundary line 41L1. Similarly, the electrode boundary line 41L2 serving as an outer circumferential line having a circumferential shape of the opening 482 being the second conductive film opening serves as an end portion on the through hole 142 side of the electrode conductive film 41B, and the electrode conductive film 41B is not formed in a region inside the electrode boundary line 41L2. The electrode boundary lines 41L1 and 41L2 serve as the first and second electrode boundary lines.

As shown in FIG. 12, the cover dielectric film 42B1 is provided in a circular shape from on the lower surface of the electrode dielectric film 40B to on the lower surface of the electrode conductive film 41B including the electrode boundary line 41L1 being the first electrode boundary line. Therefore, the cover dielectric film 42B1 covers the electrode boundary line 41L1 of the electrode conductive film 41B. Furthermore, the cover dielectric film 42B1 has a through hole 151, and the through hole 151 includes the entire through hole 141 having a circular shape in a plan view, and is provided in a circular shape wider than the through hole 141.

Similarly, the cover dielectric film 42B2 is provided in a circular shape from on the lower surface of the electrode dielectric film 40B to on the lower surface of the electrode conductive film 41B including the electrode boundary line 41L2 being the second electrode boundary line. Therefore, the cover dielectric film 42B2 covers the electrode boundary line 41L2 of the electrode conductive film 41B. Furthermore, the cover dielectric film 42B2 has a through hole 152, and the through hole 152 includes the entire through hole 142 having a circular shape in a plan view, and is provided in a circular shape wider than the through hole 142.

As shown in FIG. 13, the metal housing 2B has a circular housing bottom surface 21B and a housing side surface 22 erected in the height direction from a peripheral region of the housing bottom surface 21B, and, on the housing bottom surface 21B, has two buffer spaces 9B1 and 9B2 each recessed in the depth direction from the flat surface F2. The buffer spaces 9B1 and 9B2 are provided on the housing bottom surface 21B separately from each other.

Each of the buffer spaces 9B1 and 9B2 and the shield dielectric films 8B1 and 8B2 exhibits a circular shape in a plan view. The shield dielectric film 8B1 is provided on the bottom surface of the buffer space 9B1 in a mode in which the respective center positions of the buffer space 9B1 and the shield dielectric film 8B1 are matched with each other. Since the diameter of the shield dielectric film 8B1 is shorter than the diameter of the buffer space 9B1, the formation area of the shield dielectric film 8B1 is smaller than the formation area of the bottom surface of the buffer space 9B1, and the peripheral region of the shield dielectric film 8B1 is a region where the bottom surface of the buffer space 9B1 is exposed.

Similarly, the shield dielectric film 8B2 is provided on the bottom surface of the buffer space 9B2 in a mode in which the respective center positions of the buffer space 9B2 and the shield dielectric film 8B2 are matched with each other. Since the diameter of the shield dielectric film 8B2 is shorter than the diameter of the buffer space 9B2, the formation area of the shield dielectric film 8B2 is smaller than the formation area of the bottom surface of the buffer space 9B2, and the peripheral region of the shield dielectric film 8B2 is a region where the bottom surface of the buffer space 9B2 is exposed.

As shown in FIG. 13, the gas ejection ports 61 and 62 are provided in a peripheral region of the shield dielectric film 8B1 in the buffer space 9B1. Similarly, the gas ejection ports 63 and 64 are provided in a peripheral region of the shield dielectric film 8B2 in the buffer space 9B2. The gas ejection ports 61 and 62 are provided to penetrate the bottom surface of the buffer space 9B1, and the gas ejection ports 63 and 64 are provided to penetrate the bottom surface of the buffer space 9B2. Each of the gas ejection ports 61 to 64 exhibits a vertical structure directed downward and extending vertically along the Z direction without being inclined toward the horizontal direction.

The gas ejection ports 61 and 62 are provided symmetrically along the X direction across the shield dielectric film 8B1, and the gas ejection ports 63 and 64 are provided symmetrically along the X direction across the shield dielectric film 8B2. Each of the gas ejection ports 61 to 64 functions as an orifice.

As described above, the active gas generation apparatus 53 of the third embodiment has the through holes 141 and 142 as the first and second dielectric through holes, has the through holes 151 and 152 as the first and second cover through holes, and has the openings 481 and 482 as the first and second conductive film openings.

Furthermore, the active gas generation apparatus 53 of the third embodiment includes the shield dielectric films 8B1 and 8B2 as the first and second shield dielectric films, the gas ejection ports 61 and 62 are classified as a first gas ejection port group, and the gas ejection ports 63 and 64 are classified as a second gas ejection port group.

In addition, the active gas generation apparatus 53 of the third embodiment includes the buffer spaces 9B1 and 9B2 as the first and second buffer spaces, includes the cover dielectric films 42B1 and 42B2 as the first and second cover dielectric films, and includes the shield dielectric films 8B1 and 8B2 as the first and second shield dielectric films.

In addition, the electrode conductive film 41B of the active gas generation apparatus 53 of the third embodiment has the electrode boundary lines 41L1 and 41L2 as the first and second electrode boundary lines.

In the active gas generation apparatus 53 having this structure, the source gas G1 is supplied from the outside of the metal housing 2B into the in-housing space S2 through a supply port (not shown), and is supplied to the discharge space 5B as indicated by a broken arrow in FIG. 11.

When the source gas G1 is supplied to the discharge space 5B where the dielectric barrier discharge is generated, the source gas G1 is activated to become the active gas G2, is introduced into the buffer space 9B1 through the through hole 141 and the through hole 151, and is introduced into the buffer space 9B2 through the through hole 142 and the through hole 152.

The active gas G2 that has entered the buffer space 9B1 passes through the gas ejection ports 61 and 62 functioning as orifices provided on the bottom surface of the buffer space 9B1 and is supplied to the processing space 10 at the subsequent stage.

Similarly, the active gas G2 that has entered the buffer space 9B2 passes through the gas ejection ports 63 and 64 functioning as orifices provided on the bottom surface of the buffer space 9B2 and is supplied to the processing space 10 at the subsequent stage.

It should be noted that the discharge space 5B for generating the active gas G2 includes the main discharge space 50 and the auxiliary discharge spaces 581 and 582.

The shield dielectric film 8B1 is provided so that the bottom surface of the buffer space 9B1 and the auxiliary discharge space 581 in the metal housing 2B do not have a contact relationship, and the shield dielectric film 8B2 is provided so that the bottom surface of the buffer space 9B2 and the auxiliary discharge space 582 in the metal housing 2B do not have a contact relationship.

In the active gas generation apparatus 53 of the third embodiment, by providing the shield dielectric films 8B1 and 8B2, regarding the housing bottom surface 21B of the metal housing 2B, there is a structure in which the bottom surfaces of the buffer spaces 9B1 and 9B2 are not in contact with the auxiliary discharge spaces 581 and 582, so that a phenomenon in which metal ions are mixed into the active gas G2 is prevented.

In addition, the electric field intensity at the electrode boundary lines 41L1 and 41L2 serving as the outer circumferential lines of the openings 481 and 482 of the electrode conductive film 41B of the ground potential electrode unit 4B and the vicinity thereof is likely to be high. Thus, in the active gas generation apparatus 53, by providing the cover dielectric film 42B1 by covering the electrode boundary line 41L1, and by providing the cover dielectric film 42B2 by covering the electrode boundary line 41L2, the electrode boundary lines 41L1 and 41L2 of the electrode conductive film 41B can be prevented from coming into contact with the auxiliary discharge spaces 581 and 582.

By adopting the electrode structure of the dielectric barrier discharge as described above, since the auxiliary discharge spaces 581 and 582 are formed in addition to the main discharge space 50, the active gas generation apparatus 53 of the third embodiment expands the volume of the discharge space 5B, and expands the region of the discharge space 5B to a region relatively close to the gas ejection ports 61 to 64 functioning as orifices.

Therefore, the inactive state time until the active gas G2 generated in the discharge space 5B is transferred to the gas ejection ports 61 to 64 through the buffer spaces 9B1 and 9B2 outside the auxiliary discharge spaces 581 and 582 can be shortened. This is because the space volume of the first active gas flow path leading from the auxiliary discharge space 581 to the gas ejection ports 61 and 62 can be reduced, and the space volume of the second active gas flow path from the auxiliary discharge space 582 to the gas ejection ports 63 and 64 can be reduced.

In accordance with reduction in the inactive state time, the possibility of occurrence of gas collisional deactivation due to collision between the source gas G1 and the active gas G2 or collision/reaction between the active gases G2 can be kept low.

In addition, since the active gas generation apparatus 53 does not include a region where each of the first and second active gas flow paths is intentionally narrowed as in the active gas generation apparatus disclosed in Patent Document 1, there is no structure in which members constituting the active gas generation apparatus 53 and the first and second active gas flow paths are likely to come into contact with each other. Therefore, the active gas generation apparatus 53 of the third embodiment can keep also the possibility of occurrence of surface deactivation low.

Effect

In the active gas generation apparatus 53 of the third embodiment, the auxiliary discharge spaces 581 and 582 serving as the first and second auxiliary discharge spaces are included as a part of the discharge space 5B. The auxiliary discharge space 581 includes a through hole 141 being a first dielectric through hole, a through hole 151 being a first cover through hole, and a part of the buffer space 9B1 being a first buffer space. Similarly, the auxiliary discharge space 582 includes a through hole 142 being a second dielectric through hole, a through hole 152 being a second cover through hole, and a part of the buffer space 9B2 being a second buffer space.

Furthermore, the cover dielectric film 42B1 of the ground potential electrode unit 4B in the active gas generation apparatus 53 of the third embodiment covers the electrode boundary line 41L1 in the buffer space 9B1 and overlaps the gas ejection ports 61 and 62 in a plan view. Similarly, the cover dielectric film 42B2 covers the electrode boundary line 41L2 in the buffer space 9B2 and overlaps the gas ejection ports 63 and 64 in a plan view.

Therefore, the active gas generation apparatus 53 of the third embodiment can reliably avoid the surface deactivation phenomenon in which the active gas G2 disappears accompanying the active gas G2 in the buffer space 9B1 colliding with the electrode conductive film 41B. In particular, it is possible to reliably avoid the surface deactivation phenomenon of the active gas G2 above the gas ejection ports 61 and 62 in the buffer space 9B1.

Similarly, it is possible to reliably avoid a surface deactivation phenomenon in which the active gas G2 disappears accompanying the active gas G2 in the buffer space 9B2 colliding with the electrode conductive film 41B. In particular, it is possible to reliably avoid the surface deactivation phenomenon of the active gas G2 above the gas ejection ports 63 and 64 in the buffer space 9B2.

Therefore, as with the active gas generation apparatus 51 of the first embodiment, the active gas generation apparatus 53 of the third embodiment can exhibit a high concentration gas supply effect capable of supplying the high concentration active gas G2, from the gas ejection ports 61 to 64, to the processing space 10 at the subsequent stage.

Furthermore, since the electrode structure in the active gas generation apparatus 53 of the third embodiment does not include conductive films other than the electrode conductive films 31 and 41B, it is possible to exhibit the configuration simplification effect, as in the first embodiment.

In addition, in the active gas generation apparatus 53 of the third embodiment, the active gas G2 generated in the discharge space 5B is ejected from the gas ejection ports 61 and 62 through the first active gas flow path described above, and is ejected from the gas ejection ports 63 and 64 through the second active gas flow path described above. The auxiliary discharge spaces 581 and 582 are provided to be separated from each other, the gas ejection ports 61 and 62 are classified as a first gas ejection port, and the gas ejection ports 63 and 64 are classified as a second gas ejection port.

As a result, the active gas generation apparatus 53 of the third embodiment can eject the active gas G2 from each of the first gas ejection port group (61, 62) and the second gas ejection port group (63, 64) without lowering the concentration of the active gas G2, and thus, can enhance the uniformity of the concentration in the active gas to be supplied.

In the active gas generation apparatus 53 of the third embodiment, the gas ejection ports 61 and 62 being the first gas ejection port group are provided to penetrate the bottom surface of the buffer space 9B1 being the first buffer space, and the gas ejection ports 63 and 64 being the second gas ejection port group are provided to penetrate the bottom surface of the buffer space 9B2 being the second buffer space. The buffer spaces 9B1 and 9B2 are provided to be separated from each other on the housing bottom surface 21B.

Therefore, the first active gas flow path leading from the auxiliary discharge space 581 to each of the gas ejection ports 61 and 62 and the second active gas flow path from the auxiliary discharge space 582 to each of the gas ejection ports 63 and 64 can be completely separated.

Therefore, the active gas generation apparatus 53 of the third embodiment can eject the active gases G2 independent of each other from the respective first gas ejection port group (61, 62) and second gas ejection port group (63, 64).

The active gas generation apparatus 53 of the third embodiment is provided with the gas ejection ports 61 and 62 at a quantity ratio of 1:2 (=N) with respect to the buffer space 9B1, and is provided with the gas ejection ports 63 and 64 at a quantity ratio of 1:2 (=N) with respect to the buffer space 9B2.

Therefore, as with the active gas generation apparatus 51 of the first embodiment, the active gas generation apparatus 53 of the third embodiment can supply the active gas G2 to the processing space 10 at the subsequent stage in a stable supply amount.

Fourth Embodiment

Figure 14:
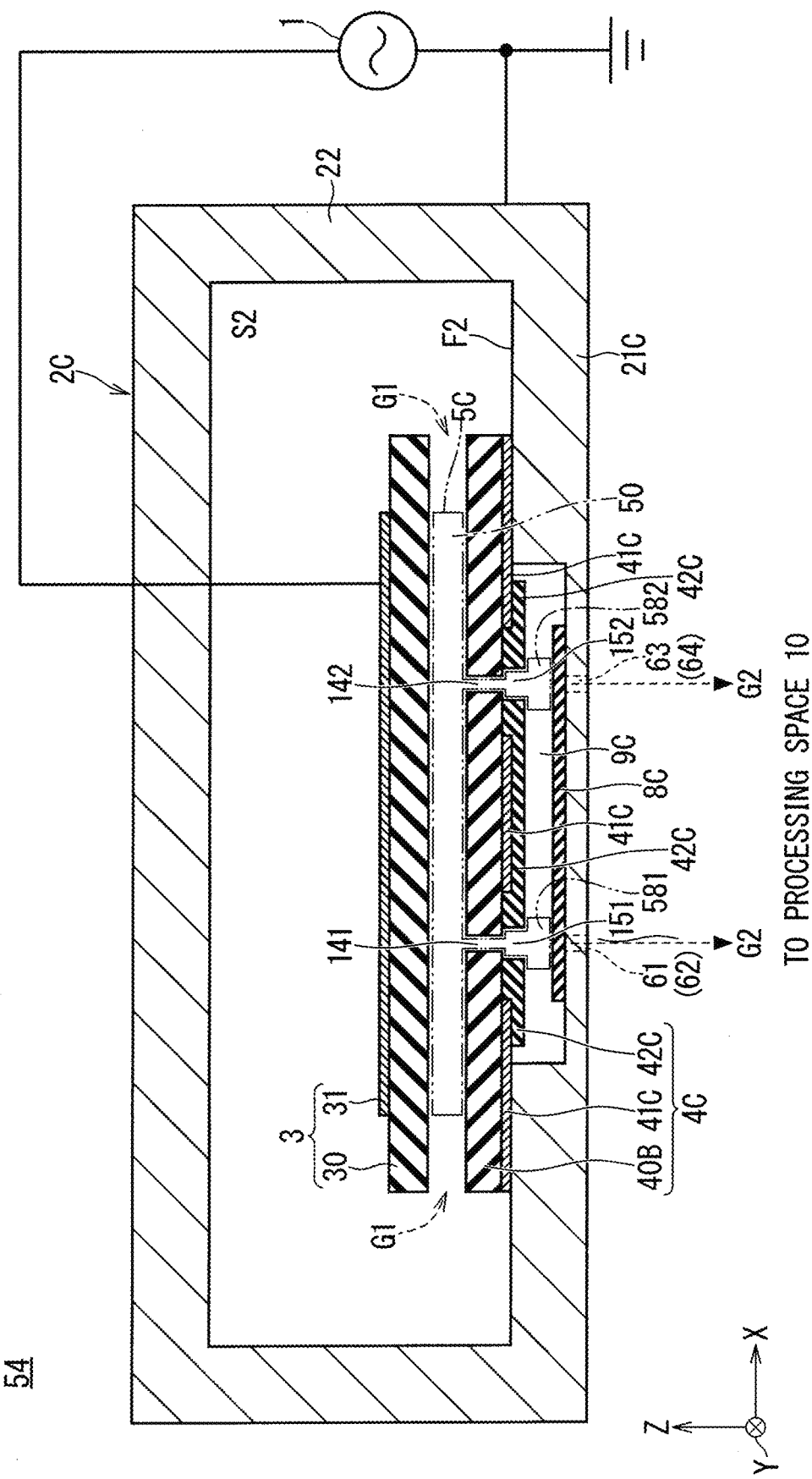
FIG. 14 is an explanatory diagram showing a cross-sectional structure of an active gas generation apparatus of a fourth embodiment.
Figure 15:
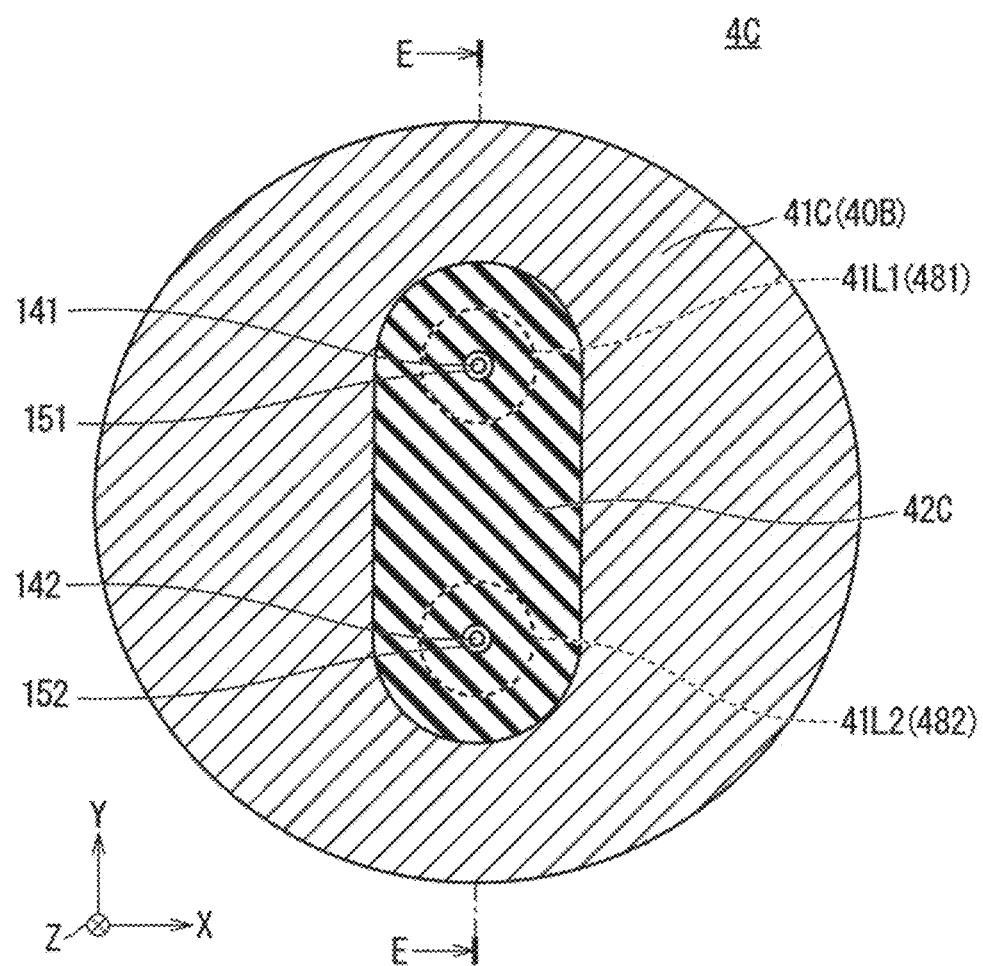
FIG. 15 is a plan view showing a planar structure of the ground potential electrode unit shown in FIG. 14.
Figure 16:
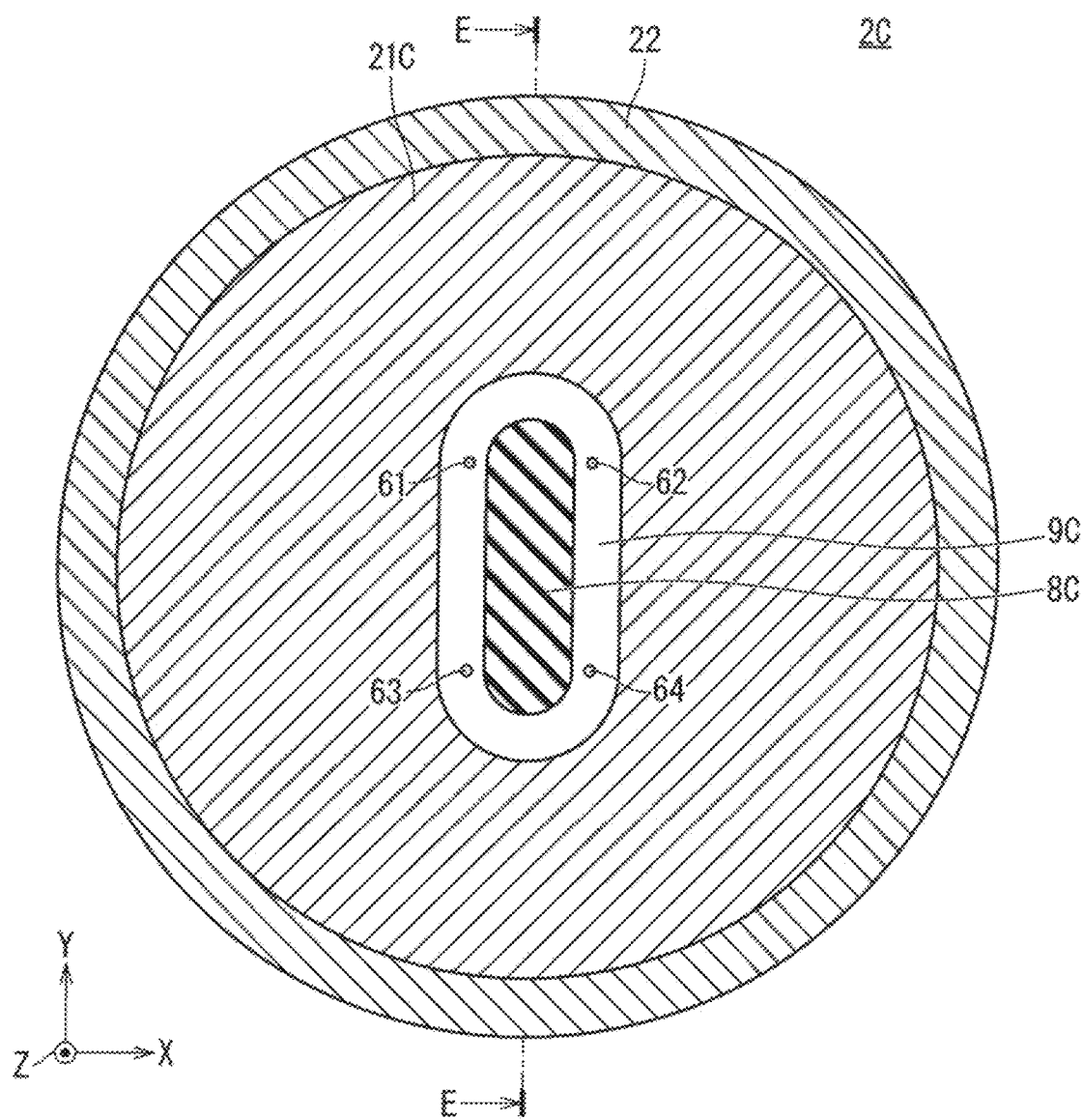
FIG. 16 is a plan view showing a planar structure of the housing bottom surface in the metal housing shown in FIG. 14.

FIG. 14 is an explanatory diagram schematically showing a cross-sectional structure of an active gas generation apparatus 54 of a fourth embodiment in the present disclosure. FIG. 15 is a plan view showing a planar structure of the ground potential electrode unit 4C. FIG. 16 is a plan view showing a planar structure of the housing bottom surface 21C in the metal housing 2C. An XYZ orthogonal coordinate system is shown in each of FIGS. 14 to 16. A cross section taken along line E-E in FIG. 15 is the structure of the ground potential electrode unit 4C shown in FIG. 14, and a cross section taken along line E-E in FIG. 16 is the structure of the metal housing 2C shown in FIG. 14.

Hereinafter, with reference to FIGS. 14 to 16, portions common to those of the active gas generation apparatus 51 of the first embodiment shown in FIGS. 1 to 5 will be denoted by the same reference numerals and description thereof will be omitted as appropriate, and the description will be focused on the feature places of the active gas generation apparatus 54 of the fourth embodiment.

The active gas generation apparatus 54 of the fourth embodiment includes a metal housing 2C, an electrode structure, an AC power supply 1, and a shield dielectric film 8C as main components.

The metal housing 2C is a housing surrounding the in-housing space S2, and includes a housing bottom surface 21C and a housing side surface 22. The housing bottom surface 21C has a bottom surface structure including a flat surface F2 and a buffer space 9C in a depth direction from the flat surface F2. The buffer space 9C recessed serves as a common buffer space having a single structure.

On the other hand, the electrode structure includes a high-voltage application electrode unit 3 and a ground potential electrode unit 4C as main components, and is disposed on the housing bottom surface 21C of the metal housing 2C so as to close the buffer space 9C.

Hereinafter, the electrode structure of the fourth embodiment will be described in detail. The electrode structure includes a high-voltage application electrode unit 3 being a first electrode component, and a ground potential electrode unit 4C being a second electrode component provided below the high-voltage application electrode unit 3.

The ground potential electrode unit 4C being the second electrode component includes an electrode dielectric film 40B being a second electrode dielectric film, an electrode conductive film 41C being a second electrode conductive film formed on the lower surface of the electrode dielectric film 40B, and a cover dielectric film 42C. The cover dielectric film 42C is provided on the lower surfaces of the electrode dielectric film 40B and the electrode conductive film 41C in the buffer space 9C.

The electrode conductive film 41C and the cover dielectric film 42C have dielectrics as constituent materials, and the electrode conductive film 41C has a conductor such as metal as a constituent material.

The electrode structure is disposed on the housing bottom surface 21C of the metal housing 2C in a mode in which the electrode conductive film 41C of the electrode structure and the flat surface F2 on the housing bottom surface 21C of the metal housing 2C are in contact with each other.

The electrode dielectric film 40B being the second electrode dielectric film has through holes 141 and 142 being first and second dielectric through holes penetrating the electrode dielectric film 40B in a region overlapping the buffer space 9C in a plan view.

The cover dielectric film 42C being a common cover dielectric film having a single structure has a through hole 151 being a first cover through hole in a region overlapping the through hole 141 in a plan view, and has a through hole 152 being a second cover through hole in a region overlapping the through hole 142 in a plan view. The through holes 151 and 152 are provided to penetrate the cover dielectric film 42C.

The shield dielectric film 8C being a common shield dielectric film having a single structure is provided in a region overlapping the through hole 141 and the through hole 151 in a plan view and overlapping the through hole 142 and the through hole 152 in a plan view on the bottom surface of the buffer space 9C.

The housing bottom surface 21C of the metal housing 2C includes the gas ejection ports 61 to 64 in the peripheral region of the shield dielectric film 8C being the common shield dielectric film. The gas ejection ports 61 and 62 are classified as a first gas ejection port, and the gas ejection ports 63 and 64 are classified as a second gas ejection port [group]. Each of the gas ejection ports 61 to 64 is provided to penetrate the bottom surface of the buffer space 9C.

Both the gas ejection ports 61 and 62 to be classified as the first gas ejection port overlap the cover dielectric film 42C in a plan view, and neither of them overlaps the through hole 141 and the through hole 151 in a plan view. Similarly, both the gas ejection ports 63 and 64 to be classified as the second gas ejection port overlap the cover dielectric film 42C in a plan view, and neither of them overlaps the through hole 142 and the through hole 152 in a plan view.

An AC voltage is applied as an applied voltage from the AC power supply 1 to the electrode conductive film 31 being the first electrode conductive film, and a setting potential being a reference potential is assigned to the electrode conductive film 41C being the second electrode conductive film through the housing bottom surface 21C of the metal housing 2C.

In the active gas generation apparatus 54 of the fourth embodiment having this configuration, a space in which the electrode dielectric film 30 and the electrode dielectric film 40B face each other is defined as a main dielectric space. In addition, two spaces in which the electrode dielectric film 30 and the shield dielectric film 8C face each other are defined as first and second auxiliary dielectric spaces.

A region where the electrode conductive films 31 and 41 overlap in a plan view in the main dielectric space is defined as the main discharge space 50.

A region including the through hole 141 and the through hole 151 in the first auxiliary dielectric space is defined as an auxiliary discharge space 581. The auxiliary discharge space 581 serves as a first auxiliary discharge space. A region including the through hole 142 and the through hole 152 in the second auxiliary dielectric space is defined as an auxiliary discharge space 582. The auxiliary discharge space 582 serves as a second auxiliary discharge space.

The auxiliary discharge space 581 includes the through hole 141, the through hole 151, and a part of the buffer space 9C below the through hole 151. A path leading from the auxiliary discharge space 581 to each of the gas ejection ports 61 and 62, in the buffer space 9C, is defined as a first active gas flow path.

Therefore, the active gas G2 generated in the discharge space 5C is ejected from the gas ejection ports 61 and 62 toward the processing space 10 through the first active gas flow path in the auxiliary discharge space 581 and the buffer space 9C. As described above, the gas ejection ports 61 and 62 serve as the first gas ejection port group.

The auxiliary discharge space 582 includes the through hole 142, the through hole 152, and a part of the buffer space 9C below the through hole 152. A path leading from the auxiliary discharge space 582 to each of the gas ejection ports 63 and 64, in the buffer space 9C, is defined as a second active gas flow path.

Therefore, the active gas G2 generated in the discharge space 5C is ejected from the gas ejection ports 63 and 64 toward the processing space 10 through the second active gas flow path in the auxiliary discharge space 582 and the buffer space 9C. As described above, the gas ejection ports 63 and 64 serve as the second gas ejection port group.

The auxiliary discharge space distance between the auxiliary discharge spaces 581 and 582 and the distance between the gas ejection port groups of the gas ejection ports 61 and 62 and the gas ejection ports 63 and 64 are respectively set to lengths that do not cause interference between the active gas G2 flowing through the first active gas flow path and the active gas G2 flowing through the second active gas flow path in the buffer space 9C.

Therefore, both the auxiliary discharge spaces 581 and 582 include a part of the buffer space 9C, but the auxiliary discharge spaces 581 and 582 are provided to be separated from each other. Similarly, the first gas ejection port group (61, 62) and the second gas ejection port group (63, 64) are provided to penetrate the bottom surface of the same buffer space 9C, but the first and second gas ejection port groups are provided to be separated from each other.

As described above, the discharge space 5C in the active gas generation apparatus 54 of the fourth embodiment includes the main discharge space 50, the auxiliary discharge space 581, and the auxiliary discharge space 582.

As shown in FIG. 15, each of the electrode dielectric film 40B and the electrode conductive film 41C exhibits a circular shape in a plan view. However, the electrode dielectric film 40B has through holes 141 and 142 serving as circular first and second dielectric through holes in a plan view, and the electrode conductive film 41C has openings 481 and 482 serving as circular first and second conductive film openings in a plan view.

Each of the through holes 141 and 142 and the openings 481 and 482 overlaps the buffer space 9C in a plan view, the opening 481 includes the through hole 141 and exhibits a shape wider than the through hole 141 in a plan view, and the opening 482 includes the through hole 142 and exhibits a shape wider than the through hole 142 in a plan view.

As shown in FIG. 15, the through holes 141 and 142 are arranged along the Y direction, and the through holes 151 and 152 are arranged to surround the through holes 141 and 142 along the Y direction.

The electrode conductive film 41C is provided on the lower surface of the electrode dielectric film 40B in a mode in which the respective center positions of the electrode dielectric film 40B and the electrode conductive film 41C are matched with each other. The diameter of the electrode conductive film 41C is set to be about the same as the diameter of the electrode dielectric film 40B, but since the openings 481 and 482 wider than the through holes 141 and 142 are provided, the formation area of the electrode conductive film 41C is smaller than the formation area of the electrode dielectric film 40B. The openings 481 and 482 serve as the first and second conductor openings.

The electrode boundary line 41L1 serving as an outer circumferential line having a circumferential shape of the opening 481 being the first conductive film opening serves as an end portion on the through hole 141 side of the electrode conductive film 41B, and the electrode conductive film 41C is not formed in a region inside the electrode boundary line 41L1. Similarly, the electrode boundary line 41L2 serving as an outer circumferential line having a circumferential shape of the opening 482 being the second conductive film opening serves as an end portion on the through hole 142 side of the electrode conductive film 41C, and the electrode conductive film 41C is not formed in a region inside the electrode boundary line 41L2. The electrode boundary lines 41L1 and 41L2 serve as the first and second electrode boundary lines.

As shown in FIG. 15, the cover dielectric film 42C exhibits a vertically long shape having a semicircular shape at both ends in the Y direction in a plan view. Then, the first partial region on the +Y direction side from the center of the cover dielectric film 42C is provided from on the lower surface of the electrode dielectric film 40B to on the lower surface of the electrode conductive film 41B including the electrode boundary line 41L1. Therefore, the cover dielectric film 42C covers the electrode boundary line 41L1 of the electrode conductive film 41B.

Similarly, the second partial region on the −Y direction side from the center of the cover dielectric film 42C is provided from on the lower surface of the electrode dielectric film 40B to on the lower surface of the electrode conductive film 41B including the electrode boundary line 41L2. Therefore, the cover dielectric film 42C covers the electrode boundary line 41L2 of the electrode conductive film 41B.

Furthermore, the first partial region of the cover dielectric film 42C has a through hole 151, and the through hole 151 includes the entire through hole 141 having a circular shape in a plan view, and is provided in a circular shape wider than the through hole 141. Similarly, the second partial region of the cover dielectric film 42C has a through hole 152, and the through hole 152 includes the entire through hole 142 having a circular shape in a plan view, and is provided in a circular shape wider than the through hole 142.

As shown in FIG. 16, the metal housing 2C has a circular housing bottom surface 21C and a housing side surface 22 erected in the height direction from a peripheral region of the housing bottom surface 21C, and, on the housing bottom surface 21C, has a buffer space 9C recessed in the depth direction from the flat surface F2.

Each of the buffer space 9C and the shield dielectric film 8C exhibits a vertically long shape having a semicircular shape at both ends in the Y direction in a plan view. The shield dielectric film 8C is provided on the bottom surface of the buffer space 9C in a mode in which the respective center positions of the buffer space 9C and the shield dielectric film 8C are matched with each other. The formation area of the shield dielectric film 8C is smaller than the formation area of the bottom surface of the buffer space 9C.

As shown in FIG. 16, the gas ejection ports 61 to 64 are provided in a peripheral region of the shield dielectric film 8C on the bottom surface of the buffer space 9C. The gas ejection ports 61 and 62 are provided symmetrically along the X direction across the shield dielectric film 8C, and the gas ejection ports 63 and 64 are provided symmetrically along the X direction across the shield dielectric film 8C.

In the gas ejection ports 61 to 64, the gas ejection ports 61 and 62 are classified as a first gas ejection port group, and the gas ejection ports 63 and 64 are classified as a second gas ejection port group. The distance between the gas ejection port groups of the gas ejection ports 61 and 62 and the gas ejection ports 63 and 64 is set to be longer than the distance between the gas ejection ports 61 and 62 and the distance between the gas ejection ports 63 and 64.

As described above, the active gas generation apparatus 54 of the fourth embodiment has the through holes 141 and 142 as the first and second dielectric through holes, has the through holes 151 and 152 as the first and second cover through holes, and has the openings 481 and 482 as the first and second conductive film openings.

Furthermore, in the active gas generation apparatus 54 of the fourth embodiment, the gas ejection ports 61 and 62 are classified as a first gas ejection port group, and the gas ejection ports 63 and 64 are classified as a second gas ejection port group.

In addition, the active gas generation apparatus 54 of the fourth embodiment includes the buffer space 9C as the common buffer space, the cover dielectric film 42C as the common cover dielectric film, and the shield dielectric film 8C as the common shield dielectric film.

In addition, the electrode conductive film 41C of the active gas generation apparatus 54 of the fourth embodiment has the electrode boundary lines 41L1 and 41L2 as the first and second electrode boundary lines.

In the active gas generation apparatus 54 having this structure, the source gas G1 is supplied from the outside of the metal housing 2C into the in-housing space S2 through a supply port (not shown), and is supplied to the discharge space 5C as indicated by a broken arrow in FIG. 14.

When the source gas G1 is supplied to the discharge space 5C where the dielectric barrier discharge is generated, the source gas G1 is activated to become the active gas G2, is introduced into the buffer space 9C through the through hole 141 and the through hole 151, and is introduced into the buffer space 9C through the through hole 142 and the through hole 152.

The active gas G2 that has entered the buffer space 9C passes through the gas ejection ports 61 to 64 functioning as orifices provided on the bottom surface of the buffer space 9C and is supplied to the processing space 10 at the subsequent stage.

It should be noted that the discharge space 5C for generating the active gas G2 includes the main discharge space 50 and the auxiliary discharge spaces 581 and 582.

The shield dielectric film 8C is provided so that the bottom surface of the buffer space 9C in the metal housing 2C and the auxiliary discharge spaces 581 and 582 do not have a contact relationship.

In the active gas generation apparatus 54 of the fourth embodiment, by providing the shield dielectric film 8C, regarding the housing bottom surface 21C of the metal housing 2C, there is a structure in which the bottom surface of the buffer space 9C is not in contact with the auxiliary discharge spaces 581 and 582, so that a phenomenon in which metal ions are mixed into the active gas G2 is prevented.

In addition, the electric field intensity at the electrode boundary lines 41L1 and 41L2 serving as the outer circumferential lines of the openings 481 and 482 of the electrode conductive film 41C of the ground potential electrode unit 4C and the vicinity thereof is likely to be high. Thus, by providing the cover dielectric film 42C so as to cover the electrode boundary lines 41L1 and 41L2, it is possible to prevent the electrode boundary lines 41L1 and 41L2 of the electrode conductive film 41C from being in contact with the auxiliary discharge spaces 581 and 582.

By adopting the electrode structure of the dielectric barrier discharge as described above, since the auxiliary discharge spaces 581 and 582 are formed in addition to the main discharge space 50, the active gas generation apparatus 54 of the fourth embodiment expands the volume of the discharge space 5C, and expands the region of the discharge space 5C to a region relatively close to the gas ejection ports 61 to 64 functioning as orifices.

Therefore, as in the third embodiment, the active gas generation apparatus 54 of the fourth embodiment can shorten the inactive state time until the active gas G2 generated in the discharge space 5C passes through the buffer space 9C outside the auxiliary discharge spaces 581 and 582 and is transferred to the gas ejection ports 61 to 64.

In accordance with reduction in the inactive state time, the possibility of occurrence of gas collisional deactivation due to collision between the source gas G1 and the active gas G2 or collision/reaction between the active gases G2 can be kept low.

In addition, since the active gas generation apparatus 54 does not include a region where each of the first and second active gas flow paths is intentionally narrowed as in the active gas generation apparatus disclosed in Patent Document 1, there is no structure in which members constituting the active gas generation apparatus 54 and the first and second active gas flow paths are likely to come into contact with each other. Therefore, the active gas generation apparatus 54 of the fourth embodiment can keep also the possibility of occurrence of surface deactivation low.

Effect

In the active gas generation apparatus 54 of the fourth embodiment, the auxiliary discharge space 581 being a part of the discharge space 5C includes the through hole 141 being the first dielectric through hole, the through hole 151 being the first cover through hole, and a part of the buffer space 9C being the common buffer space. Similarly, the auxiliary discharge space 582 includes the through hole 142 being the second dielectric through hole, the through hole 152 being the second cover through hole, and a part of the buffer space 9C.

Furthermore, the cover dielectric film 42C of the ground potential electrode unit 4C in the active gas generation apparatus 54 of the fourth embodiment covers the electrode boundary lines 41L1 and 41L2 in the buffer space 9C and overlaps the gas ejection ports 61 to 64 in a plan view.

Therefore, the active gas generation apparatus 54 of the fourth embodiment can reliably avoid the surface deactivation phenomenon in which the active gas G2 disappears accompanying the active gas G2 in the buffer space 9C colliding with the electrode conductive film 41C. In particular, it is possible to reliably avoid the surface deactivation phenomenon of the active gas G2 above the gas ejection ports 61 to 64 in the buffer space 9C.

Therefore, as with the active gas generation apparatus 51 of the first embodiment, the active gas generation apparatus 54 of the fourth embodiment can exhibit a high concentration gas supply effect capable of supplying the high concentration active gas G2, from the gas ejection ports 61 to 64, to the processing space 10 at the subsequent stage.

Furthermore, since the electrode structure in the active gas generation apparatus 54 of the fourth embodiment does not include conductive films other than the electrode conductive films 31 and 41B, it is possible to exhibit the configuration simplification effect, as in the first embodiment.

In addition, in the active gas generation apparatus 54 of the fourth embodiment, the active gas G2 generated in the discharge space 5C is ejected from the gas ejection ports 61 and 62 through the first active gas flow path described above, and is ejected from the gas ejection ports 63 and 64 through the second active gas flow path described above. The auxiliary discharge spaces 581 and 582 are provided to be separated from each other, the gas ejection ports 61 and 62 are classified as a first gas ejection port group, and the gas ejection ports 63 and 64 are classified as a second gas ejection port group.

As a result, the active gas generation apparatus 54 of the fourth embodiment can enhance the uniformity of the concentration in the active gas to be supplied, as in the third embodiment.

The active gas generation apparatus 54 of the fourth embodiment includes a buffer space 9C being a common buffer space having a single structure, a cover dielectric film 42C being a common cover dielectric film having a single structure, and a shield dielectric film 8C being a common shield dielectric film having a single structure. The gas ejection ports 61 to 64 is provided to penetrate the bottom surface of the buffer space 9C, and the shield dielectric film 8C is provided on the bottom surface of the buffer space 9C.

Therefore, as compared with the active gas generation apparatus 53 of the third embodiment, in the active gas generation apparatus 54 of the fourth embodiment, each of the buffer space 9C, the cover dielectric film 42C, and the shield dielectric film 8C has a single structure, and the number of components can be suppressed.

Furthermore, the active gas generation apparatus 54 of the fourth embodiment can eject the active gas G2 from the first gas ejection port group (61, 62) and the second gas ejection port group (63, 64) separated from each other to increase the uniformity of the concentration of the active gas G2.

The active gas generation apparatus 54 of the fourth embodiment is provided with the gas ejection ports 61 to 64 at a quantity ratio of 1:4 (=N) with respect to the buffer space 9C.

Therefore, as compared with the first to third embodiments, in the active gas generation apparatus 54 of the fourth embodiment, since the N being the quantity ratio is increased from "2" to "4", the active gas G2 can be supplied to the processing space 10 at the subsequent stage in a more stable supply amount.

Others

Although the present disclosure is described in detail, the above description is in all aspects exemplification, and the present disclosure is not limited to the above description. It is understood that myriad modifications not exemplified can be assumed without departing from the scope of the present disclosure.

That is, in the present disclosure, each embodiment can be freely combined, and each embodiment can be appropriately modified, or omitted within the scope of the present disclosure.

For example, the gas ejection ports 61 to 64 of each of the active gas generation apparatus 53 of the third embodiment and the active gas generation apparatus 54 of the fourth embodiment may be changed from a vertical structure to, as in the gas ejection ports 71 and 72 of the active gas generation apparatus 52 of the second embodiment, an oblique structure.

In the third embodiment, a structure is shown in which two sets of the dielectric through hole, auxiliary discharge space, buffer space, cover dielectric film, shield dielectric film, and the like are provided, but the active gas generation apparatus 53 of the third embodiment may be extended, and "3" or more sets of the dielectric through hole, auxiliary discharge space, buffer space, cover dielectric film, shield dielectric film, and the like may be provided.

In the fourth embodiment, a structure is shown in which two sets of the dielectric through hole, auxiliary discharge space, and the like are provided, but the active gas generation apparatus 54 of the fourth embodiment may be extended, and "3" or more sets of the dielectric through hole, auxiliary discharge space, and the like may be provided.

The invention claimed is:

1. An active gas generation apparatus configured to generate an active gas by activating a source gas supplied to a discharge space, the active gas generation apparatus comprising:
  a housing configured to house an electrode structure in an in-housing space, the housing having conductivity; and
  the electrode structure disposed on a bottom surface of the housing,
    wherein the housing has a bottom surface structure including a flat surface and a buffer space recessed in a depth direction from the flat surface, and the electrode structure is disposed to close the buffer space,
    wherein the electrode structure includes:
      a first electrode component, and
      a second electrode component provided below the first electrode component,
    wherein the first electrode component includes a first electrode dielectric film and a first electrode conductive film formed on an upper surface of the first electrode dielectric film,
    wherein the second electrode component includes a second electrode dielectric film and a second electrode conductive film formed on a lower surface of the second electrode dielectric film, and the second electrode conductive film and the flat surface of the housing are in contact with each other,
    wherein the second electrode dielectric film has a dielectric through hole penetrating the second electrode dielectric film in a region overlapping the buffer space in a plan view, the second electrode conductive film has a conductive film opening in a region overlapping the buffer space in a plan view, the conductive film opening overlaps the dielectric through hole in a plan view, and an outer circumferential line of the conductive film opening is defined as an electrode boundary line,
    wherein the second electrode component further includes a cover dielectric film covering the electrode boundary line of the second electrode conductive film in the buffer space, and the cover dielectric film has a cover through hole penetrating the cover dielectric film in a region overlapping the dielectric through hole in a plan view,
  the active gas generation apparatus further comprising:
  a shield dielectric film provided in a region overlapping the dielectric through hole and the cover through hole in a plan view on a bottom surface of the buffer space, and
  a gas ejection port provided to penetrate a bottom surface of the buffer space in a peripheral region of the shield dielectric film,
    wherein the gas ejection port overlaps the cover dielectric film in a plan view, and does not overlap the dielectric through hole nor the cover through hole in a plan view,
    wherein an AC voltage is applied to the first electrode conductive film, and the second electrode conductive film is set to a reference potential through the housing,
    wherein a space in which the first electrode dielectric film and the second electrode dielectric film face each other is defined as a main dielectric space, and a space in which the first electrode dielectric film and the shield dielectric film face each other is defined as an auxiliary dielectric space,
    wherein a region where the first and second electrode conductive films overlap in a plan view in the main dielectric space is defined as a main discharge space, a region including the dielectric through hole and the cover through hole in the auxiliary dielectric space is defined as an auxiliary discharge space, and the auxiliary discharge space includes a part of the buffer space above the shield dielectric film,
    wherein the discharge space includes the main discharge space and the auxiliary discharge space, and
    wherein a path leading from the auxiliary discharge space to the gas ejection port is defined as an active gas flow path.

2. The active gas generation apparatus according to claim 1,
  wherein the cover through hole includes first and second cover through holes,
  wherein the dielectric through hole includes first and second dielectric through holes,
  wherein the conductive film opening includes first and second conductive film openings,
  wherein the electrode boundary line includes first and second electrode boundary lines,
  wherein the gas ejection port includes first and second gas ejection ports, wherein the auxiliary discharge space includes first and second auxiliary discharge spaces, wherein the active gas flow path includes first and second active gas flow paths, wherein the first dielectric through hole and the first cover through hole overlap each other in a plan view, and the second dielectric through hole and the second cover through hole overlap each other in a plan view, wherein the first conductive film opening overlaps the first dielectric through hole in a plan view, the second conductive film opening overlaps the second dielectric through hole in a plan view, an outer circumferential line of the first conductive film opening is defined as the first electrode boundary line, and an outer circumferential line of the second conductive film opening is defined as the second electrode boundary line, wherein the first gas ejection port does not overlap the first dielectric through hole nor the first cover through hole in a plan view, and the second gas ejection port does not overlap the second dielectric through hole nor the second cover through hole in a plan view, wherein two spaces in which the first electrode dielectric film and the shield dielectric film face each other are defined as first and second auxiliary dielectric spaces, the first and second auxiliary dielectric spaces are separated from each other, and the auxiliary dielectric space includes the first and second auxiliary dielectric spaces, wherein a region including the first dielectric through hole and the first cover through hole in the first auxiliary dielectric space is defined as the first auxiliary discharge space, a region including the second dielectric through hole and the second cover through hole in the second auxiliary dielectric space is defined as the second auxiliary discharge space, and the first and second auxiliary discharge spaces are separated from each other, wherein each of the first and second auxiliary discharge spaces includes a part of the buffer space above the shield dielectric film, and wherein a path leading from the first auxiliary discharge space to the first gas ejection port in the buffer space is defined as the first active gas flow path, and a path leading from the second auxiliary discharge space to the second gas ejection port is defined as the second active gas flow path.

3. The active gas generation apparatus according to claim 2, wherein the buffer space includes a first buffer space and a second buffer space, and the first and second buffer spaces are provided to be separated from each other, wherein the cover dielectric film includes first and second cover dielectric films, wherein the shield dielectric film includes first and second shield dielectric films, wherein the first cover through hole is provided to penetrate the first cover dielectric film, and the second cover through hole is provided to penetrate the second cover dielectric film, wherein the first dielectric through hole, the first conductive film opening, and the first cover through hole overlap the first buffer space in a plan view, and the second dielectric through hole, the second conductive film opening, and the second cover through hole overlap the second buffer space in a plan view, wherein the first cover dielectric film covers the first electrode boundary line, and the second cover dielectric film covers the second electrode boundary line, wherein the first shield dielectric film is provided on a bottom surface of the first buffer space, and the second shield dielectric film is provided on a bottom surface of the second buffer space, wherein the first shield dielectric film overlaps the first dielectric through hole and the first cover through hole in a plan view, and the second shield dielectric film overlaps the second dielectric through hole and the second cover through hole in a plan view, wherein the first gas ejection port is provided to penetrate a bottom surface of the first buffer space in a peripheral region of the first shield dielectric film, and the first gas ejection port overlaps the first cover dielectric film in a plan view, wherein the second gas ejection port is provided to penetrate a bottom surface of the second buffer space in a peripheral region of the second shield dielectric film, and the second gas ejection port overlaps the second cover dielectric film in a plan view, wherein a region where the first electrode dielectric film and the first shield dielectric film face each other is defined as the first auxiliary dielectric space, and a region where the second electrode dielectric film and the second shield dielectric film face each other is defined as the second auxiliary dielectric space, and wherein the first auxiliary discharge space further includes a part of the first buffer space above the first shield dielectric film, and the second auxiliary discharge space further includes a part of the second buffer space above the second shield dielectric film.

4. The active gas generation apparatus according to claim 2, wherein the buffer space includes a common buffer space having a single structure, wherein the cover dielectric film includes a common cover dielectric film having a single structure, wherein the shield dielectric film includes a common shield dielectric film having a single structure, wherein the common cover dielectric film overlaps the common buffer space in a plan view and covers the first and second electrode boundary lines, wherein the first and second cover through holes are provided to penetrate the common cover dielectric film, wherein the common shield dielectric film is provided on a bottom surface of the common buffer space, and wherein the first and second gas ejection ports penetrate a bottom surface of the common buffer space in a peripheral region of the common shield dielectric film, the first and second gas ejection ports are provided to be separated from each other, and the first and second gas ejection ports overlap the common cover dielectric film in a plan view.

5. The active gas generation apparatus according to claim 1, wherein the gas ejection port has an oblique structure directed downward and inclined toward a horizontal direction.

6. The active gas generation apparatus according to claim 1, wherein the gas ejection ports are provided at a quantity ratio of 1:N (≥2) with respect to the buffer space.

* * * * *